US010726552B2

(12) United States Patent
Sun et al.

(10) Patent No.: US 10,726,552 B2
(45) Date of Patent: Jul. 28, 2020

(54) QUANTIFICATION OF MAGNETIC RESONANCE DATA BY ADAPTIVE FITTING OF DOWNSAMPLED IMAGES

(71) Applicant: The General Hospital Corporation, Boston, MA (US)

(72) Inventors: Phillip Zhe Sun, Woburn, MA (US); Iris Yuwen Zhou, Malden, MA (US)

(73) Assignee: The General Hospital Corporation, Boston, MA (US)

( * ) Notice: Subject to any disclaimer, the term of this patent is extended or adjusted under 35 U.S.C. 154(b) by 85 days.

(21) Appl. No.: 15/926,954

(22) Filed: Mar. 20, 2018

(65) Prior Publication Data
US 2018/0268546 A1 Sep. 20, 2018

Related U.S. Application Data

(60) Provisional application No. 62/473,800, filed on Mar. 20, 2017.

(51) Int. Cl.
G06T 7/00 (2017.01)
G06T 7/11 (2017.01)
G01R 33/48 (2006.01)

(52) U.S. Cl.
CPC .......... *G06T 7/0014* (2013.01); *G01R 33/48* (2013.01); *G06T 7/11* (2017.01); *G06T 2207/10096* (2013.01); *G06T 2207/20016* (2013.01); *G06T 2207/20104* (2013.01)

(58) Field of Classification Search
CPC .......... G01R 33/48; G06T 2207/10096; G06T 2207/20016; G06T 2207/20104; G06T 7/0014; G06T 7/11
See application file for complete search history.

(56) References Cited

U.S. PATENT DOCUMENTS 6,943,033 B2    9/2005    Van Zijl
2016/0081578 A1*   3/2016    Gazit ............... A61B 5/055
                                                                  600/410

OTHER PUBLICATIONS

Chen, Shu-Zhong, et al. "Chemical exchange saturation transfer (CEST) MR technique for in-vivo liver imaging at 3.0 tesla." European radiology 26.6 (2015): 1792-1800. (Year: 2015).*

Zaiß, Moritz, Benjamin Schmitt, and Peter Bachert. "Quantitative separation of CEST effect from magnetization transfer and spillover effects by Lorentzian-line-fit analysis of z-spectra." Journal of magnetic resonance 211.2 (2011): 149-155. (Year: 2011).*

(Continued)

*Primary Examiner* — Nirav G Patel
(74) *Attorney, Agent, or Firm* — Quarles & Brady LLP

(57) ABSTRACT

The present disclosure relates to systems and methods for determining quantitative chemical exchange or exchangeable proton information from a region-of-interest in a subject. The methods and systems use adaptive fitting to quantify magnetic resonance (MR) data, such as chemical exchange saturation transfer magnetic resonance imaging (CEST MRI) images, using initial values based on, for example, Lorentzian fitting. Images are iteratively less downsampled until quantitative maps of desired resolution are obtained. Such an approach allows for reliable fitting at a faster fitting speed, and is less susceptible to suboptimal signal to noise (SNR) than conventional methods.

16 Claims, 13 Drawing Sheets
(7 of 13 Drawing Sheet(s) Filed in Color)

(56) References Cited

OTHER PUBLICATIONS

Barth, R. F. "Rat brain tumor models in experimental neuro-oncology: the 9L, C6, T9, F98, RG2 (D74), RT-2 and CNS-1 gliomas." Journal of neuro-oncology 36.1 (1998): 91-102.

Barth, R. F., et al. "Rat brain tumor models in experimental neuro-oncology: the C6, 9L, T9, RG2, F98, BT4C, RT-2 and CNS-1 gliomas." Journal of neuro-oncology 94.3 (2009): 299-312.

Cai, K. et al. CEST signal at 2 ppm (CEST@2 ppm) from Zspectral fitting correlates with creatine distribution in brain tumor. NMR in biomedicine 28, 1-8, doi:10.1002/nbm.3216 (2015).

Cai, K. et al. Creatine CEST MRI for Differentiating Gliomas with Different Degrees of Aggressiveness. Molecular imaging and biology: MIB: the official publication of the Academy of Molecular Imaging, doi:10.1007/s11307-016-0995-0 (2016).

Cai, K. et al. Magnetic resonance imaging of glutamate. Nature medicine 18, 302-306, doi:10.1038/nm.2615 (2012).

Chan, K. W. et al. Natural Dglucose as a biodegradable MRI contrast agent for detecting cancer. Magnetic resonance in medicine 68, 1764-1773, doi:10.1002/mrm.24520 (2012).

Chen, L. Q. et al. Evaluations of extracellular pH within in vivo tumors using acidoCEST MRI. Magnetic resonance in medicine 72, 1408-1417 (2014).

Cheung, J.S., et al, 2012. Fast radio-frequency enforced steady state (FRESS) spin echo MRI for quantitative T2 mapping: minimizing the apparent repetition time (TR) dependence for fast T2 measurement. NMR Biomed 25, 189-194.

Desmond, K. L., et al. Mapping of amide, amine, and aliphatic peaks in the CEST spectra of murine xenografts at 7 T. Magn. Reson. Med. 71, 1841-1853, doi:10.1002/mrm.24822 (2014).

Dixon, W. T. et al. A concentration—independent method to measure exchange rates in PARACEST agents. Magnetic resonance in medicine: official journal of the Society of Magnetic Resonance in Medicine/Society of Magnetic Resonance in Medicine 63, 625-632, doi:10.1002/mrm.22242 (2010).

Fulci, G. et al. Cyclophosphamide enhances glioma virotherapy by inhibiting innate immune responses. Proc Natl Acad Sci USA 103, 12873-12878, doi:10.1073/pnas.0605496103 (2006).

Guo, Y. et al. pH—sensitive MRI demarcates graded tissue acidification during acute stroke-pH specificity enhancement with magnetization transfer and relaxation-normalized amide proton transfer (APT) MRI. NeuroImage 141, 242-249, doi:10.1016/j.neuroimage.2016.07.025 (2016).

Haris, M. et al. In vivo Magnetic Resonance Imaging of Tumor Protease Activity. Sci Rep 4, 6081, doi:10.1038/srep06081 (2014).

Heo, H. Y. et al. Whole-brain amide proton transfer (APT) and nuclear overhauser enhancement (NOE) imaging in glioma patients using low-power steady-state pulsed chemical exchange saturation transfer (CEST) imaging at 7T. J Magn Reson Imaging. doi:10.1002/jmri.25108 (2016).

Heo, H. Y., et al. Quantitative assessment of amide proton transfer (APT) and nuclear overhauser enhancement (NOE) imaging with extrapolated semi-solid magnetization transfer reference (EMR) signals: Application to a rat glioma model at 4.7 Tesla. Magnetic resonance in medicine 75, 137-149, doi:10.1002/mrm.25581 (2016).

Jia, G. et al. Amide proton transfer MR imaging of prostate cancer: A preliminary study. J Magn Reson Imaging 33, 647-654 (2011).

Jin, T., et al. MR imaging of the amide-proton transfer effect and the pH-insensitive nuclear overhauser effect at 9.4 T. Magnetic resonance in medicine 69, 760-770, doi:10.1002/mrm.24315 (2013).

Jones, C. K. et al. Amide proton transfer imaging of human brain tumors at 3T. Magnetic resonance in medicine 56, 585-592, doi:10.1002/mrm.20989 (2006).

Jones, C. K. et al. Nuclear Overhauser enhancement (NOE) imaging in the human brain at 7T. NeuroImage 77, 114-124, doi:10.1016/j.neuroimage.2013.03.047 (2013).

Kim, M., et al. Water saturation shift referencing (WASSR) for chemical exchange saturation transfer (CEST) experiments. Magnetic resonance in medicine 61, 1441-1450 (2009).

Lee, D. H. et al. Quantitative assessment of the effects of water proton concentration and water T changes on amide proton transfer (APT) and nuclear overhauser enhancement (NOE) MRI: The origin of the APT imaging signal in brain tumor. Magnetic resonance in medicine, doi:10.1002/mrm.26131 (2016).

Liu, G., et al. Nuts and bolts of chemical exchange saturation transfer MRI. NMR in biomedicine 26, 810-828, doi:10.1002/nbm.2899 (2013).

Longo, D. L. et al. A general MRI-CEST ratiometric approach for pH imaging: demonstration of in vivo pH mapping with iobitridol. Journal of the American Chemical Society 136, 14333-14336, doi:10.1021/ja5059313 (2014).

Moon, B. F. et al. A comparison of iopromide and iopamidol, two acidoCEST MRI contrast media that measure tumor extracellular pH. Contrast media & molecular imaging 10, 446-455, doi:10.1002/cmmi.1647 (2015).

Sagiyama, K. et al. In vivo chemical exchange saturation transfer imaging allows early detection of a therapeutic response in glioblastoma. Proc Natl Acad Sci USA 111, 4542-4547, doi:10.1073/pnas.1323855111 (2014).

Salhotra, A. et al. Amide proton transfer imaging of 9L gliosarcoma and human glioblastoma xenografts. NMR in biomedicine 21, 489-497, doi:10.1002/nbm.1216 (2008).

Scheidegger, R., et al. Contributors to contrast between glioma and brain tissue in chemical exchange saturation transfer sensitive imaging at 3 Tesla. NeuroImage 99, 256-268, doi:10.1016/j.neuroimage.2014.05.036 (2014).

Sherry, A. D. et al. Chemical exchange saturation transfer contrast agents for magnetic resonance imaging. Annual review of biomedical engineering 10, 391-411, doi:10.1146/annurev.bioeng.9.060906.151929 (2008).

Stancanello, J. et al. Development and validation of a smoothing-splines-based correction method for improving the analysis of CEST-MR images. Contrast media & molecular imaging 3, 136-149, doi:10.1002/cmmi.240 (2008).

Sun, P. Z. Simplified quantification of labile proton concentration-weighted chemical exchange rate (k(ws) ) with RF saturation time dependent ratiometric analysis (QUESTRA): normalization of relaxation and RF irradiation spillover effects for improved quantitative chemical exchange saturation transfer (CEST) MRI. Magnetic resonance in medicine: 67, 936-942, doi:10.1002/mrm.23068 (2012).

Sun, P. Z., et al. Early experience of translating pH-weighted MRI to image human subjects at 3 Tesla. Stroke 41, S147-151, doi:10.1161/STROKEAHA.110.595777 (2010).

Sun, P. Z., et al. Association between pH-weighted endogenous amide proton chemical exchange saturation transfer MRI and tissue lactic acidosis during acute ischemic stroke. Journal of cerebral blood flow and metabolism. 31, 1743-1750, doi:10.1038/jcbfm.2011.23 (2011).

Sun, P. Z., et al. Imaging acute ischemic tissue acidosis with pH-sensitive endogenous amide proton transfer (APT) MRI-correction of tissue relaxation and concomitantRF irradiation effects toward mapping quantitative cerebral tissue pH. NeuroImage 60, 1-6, doi:10.1016/j.neuroimage.2011.11.091 (2012).

Sun, P. Z., et al. Detection of the ischemic penumbra using pH-weighted MRI. Journal of cerebral blood flow and metabolism: official journal of the International Society of Cerebral Blood Flow and Metabolism 27, 1129-1136, doi:10.1038/sj.jcbfm.9600424 (2007).

Tietze, A. et al. Assessment of ischemic penumbra in patients with hyperacute stroke using amide proton transfer (APT) chemical exchange saturation transfer (CEST) MRI. NMR in biomedicine 27, 163-174, doi:10.1002/nbm.3048 (2014).

Van Zijl, P. C. et al. Chemical exchange saturation transfer (CEST): what is in a name and what isn't? Magnetic resonance in medicine 65, 927-948, doi:10.1002/mrm.22761 (2011).

Walker-Samuel, S. et al. In vivo imaging of glucose uptake and metabolism in tumors. Nature medicine 19, 1067-1072, doi:10.1038/nm.3252 (2013).

Ward, K. M., et al. A new class of contrast agents for MRI based on proton chemical exchange dependent saturation transfer (CEST). Journal of magnetic resonance 143, 79-87, doi:10.1006/jmre.1999.1956 (2000).

(56) References Cited

OTHER PUBLICATIONS

Windschuh, J. et al. Correction of B1-inhomogeneities for relaxation-compensated CEST imaging at 7 T. NMR in biomedicine 28, 529-537, doi:10.1002/nbm.3283 (2015).

Wu, R., et al. Quantitative chemical exchange saturation transfer (qCEST) MR-omega plot analysis of RF-spillover-corrected inverse CEST ratio asymmetry for simultaneous determination of labile proton ratio and exchange rate. NMR in biomedicine 28, 376-383, doi:10.1002/nbm.3257 (2015).

Xu, J. et al. On the origins of chemical exchange saturation transfer (CEST) contrast in tumors at 9.4?T. NMR in biomedicine 27, 406-416 (2014).

Yan, K. et al. Assessing Amide Proton Transfer (APT) MRI Contrast Origins in 9 L Gliosarcoma in the Rat Brain Using Proteomic Analysis. Molecular imaging and biology: MIB: the official publication of the Academy of Molecular Imaging 17, 479-487, doi:10.1007/s11307-015-0828-6 (2015).

Yoo, B. et al. Detection of in vivo enzyme activity with CatalyCEST MRI. Magnetic resonance in medicine: official journal of the Society of Magnetic Resonance in Medicine/Society of Magnetic Resonance in Medicine 71, 1221-1230, doi:10.1002/mrm.24763 (2014).

Zaiss, M. et al. Chemical exchange saturation transfer (CEST) and MR Z-spectroscopy in vivo: a review of theoretical approaches and methods. Physics in medicine and biology 58, R221-269, doi:10.1088/0031-9155/58/22/R221 (2013).

Zaiss, M. et al. Inverse Z-spectrum analysis for spillover-, MT-, and T1-corrected steady-state pulsed CEST-MRI-application to pH-weighted MRI of acute stroke. NMR in biomedicine 27,240-252, doi:10.1002/nbm.3054 (2014).

Zaiss, M. et al. Relaxation-compensated CEST-MRI of the human brain at 7T: Unbiased insight into NOE and amide signal changes in human glioblastoma. NeuroImage 112, 180-188, doi:10.1016/j.neuroimage.2015.02.040 (2015).

Zhang, S., et al. MRI thermometry based on PARACEST agents. Journal of the American Chemical Society 127, 17572-17573, doi:10.1021/ja053799t (2005).

Zhang, X.-Y. et al. A new NOE-mediated MT signal at around -1.6?ppm for detecting ischemic stroke in rat brain. Magnetic resonance imaging 34, 1100-1106, doi:10.1016/j.mri.2016.05.002 (2016).

Zhang, X.-Y. et al. "MR imaging of a novel NOE-mediated magnetization transfer with water in rat brain at 9.4 T." Magnetic resonance in medicine 78.2 (2017): 588-597.

Zhou, J. et al., in "Using the Amide Proton Signals of Intracellular Proteins and Peptides to Detect pH Effects in MRI," Nature Medicine, 2003; 9:1085-1090.

Zhou, J., et al. Amide proton transfer (APT) contrast for imaging of brain tumors. Magnetic resonance in medicine 50, 1120-1126, doi:10.1002/mrm.10651 (2003).

\* cited by examiner

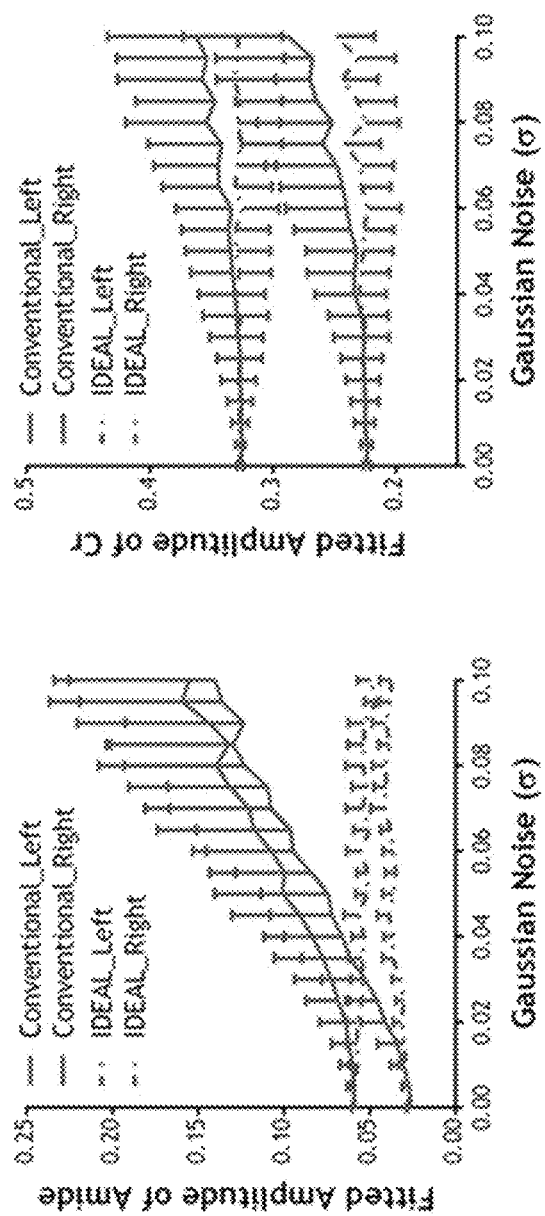
FIG. 7C
FIG. 7B
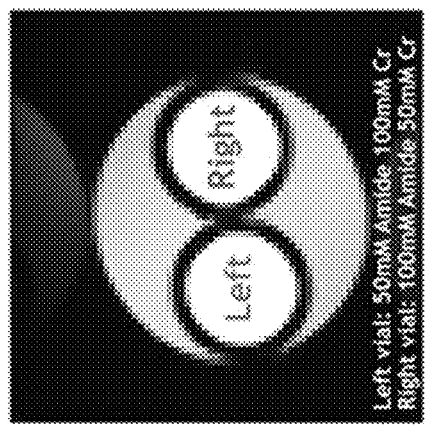
FIG. 7A

QUANTIFICATION OF MAGNETIC RESONANCE DATA BY ADAPTIVE FITTING OF DOWNSAMPLED IMAGES

CROSS-REFERENCE TO RELATED APPLICATIONS

This application is based on, claims the benefit of, and incorporates herein by reference, U.S. Provisional Patent Application 62/473,800, filed Mar. 20, 2017.

STATEMENT REGARDING FEDERALLY SPONSORED RESEARCH

This invention was made with government support under 1R01NS083654 awarded by the National Institutes of Health. The government has certain rights in the invention.

BACKGROUND

When a substance such as human tissue is subjected to a uniform magnetic field (polarizing field $B_0$), the individual magnetic moments of the nuclei in the tissue attempt to align with this polarizing field, but precess about it in random order at their characteristic Larmor frequency. If the substance, or tissue, is subjected to a magnetic field (excitation field $B_1$) that is in the x-y plane and that is near the Larmor frequency, the net aligned moment, $M_z$, may be rotated, or "tipped," into the x-y plane to produce a net transverse magnetic moment $M_{xy}$. A signal is emitted by the excited nuclei or "spins," after the excitation signal $B_1$ is terminated, and this signal may be received and processed to form an image.

When utilizing these "MR" (magnetic resonance) signals to produce images, magnetic field gradients ($G_x$, $G_y$, and $G_z$) are employed. Typically, the region to be imaged is scanned by a sequence of measurement cycles in which these gradients vary according to the particular localization method being used. The resulting set of received MR signals are digitized and processed to reconstruct the image using one of many well-known reconstruction techniques.

The measurement cycle used to acquire each MR signal is performed under the direction of a pulse sequence produced by a pulse sequencer. Clinically available magnetic resonance imaging (MRI) systems store a library of such pulse sequences that can be prescribed to meet the needs of many different clinical applications. Research MRI systems include a library of clinically-proven pulse sequences and they also enable the development of new pulse sequences.

The MR signals acquired with an MRI system are signal samples of the subject of the examination in Fourier space, or what is often referred to in the art as "k-space." Each MR measurement cycle, or pulse sequence, typically samples a portion of k-space along a sampling trajectory characteristic of that pulse sequence. Most pulse sequences sample k-space in a raster scan-like pattern sometimes referred to as a "spin-warp," a "Fourier," a "rectilinear," or a "Cartesian" scan. The spin-warp scan technique employs a variable amplitude phase encoding magnetic field gradient pulse prior to the acquisition of MR spin-echo signals to phase encode spatial information in the direction of this gradient. In a two-dimensional implementation ("2DFT"), for example, spatial information is encoded in one direction by applying a phase encoding gradient, $G_y$, along that direction, and then a spin-echo signal is acquired in the presence of a readout magnetic field gradient, $G_x$, in a direction orthogonal to the phase encoding direction. The readout gradient present during the spin-echo acquisition encodes spatial information in the orthogonal direction. In a typical 2DFT pulse sequence, the magnitude of the phase encoding gradient pulse, $G_y$, is incremented, $\Delta G_y$, in the sequence of measurement cycles, or "views" that are acquired during the scan to produce a set of k-space MR data from which an entire image can be reconstructed.

MRI can be used to measure the exchange of magnetization between molecules to provide unique information about the chemical and molecular environment of samples or tissues. One type of such exchange measurement is broadly referred to in the field as magnetization transfer. This technique is capable of measuring the exchange of magnetization from spin species that have short transverse relaxation times ($T_2$). Because many different molecules have short $T_2$, this technique is not particularly specific.

A second type of magnetization exchange occurs between water protons and a molecule with long enough $T_2$ that its difference in frequency from water can be observed. Saturation of the magnetization from this molecule will generally decrease the measurable signal from water. This effect is generally referred to in the field as chemical exchange saturation transfer ("CEST"). Two different types of molecules can generate CEST effects: endogenous, or naturally occurring, molecules and exogenous contrast agents. In either instance, the molecules whose chemical exchange with water produces the CEST effect are generally referred to as so-called "exchangeable protons."

The CEST imaging method offers three advantages over traditional molecular MRI techniques. First, in some cases the molecules of interest within the subject can be directly detected. This feature mitigates the need for administering contrast agents to the subject. Second, the image contrast mechanism can be controlled with the RF pulses produced by the MRI system and, as such, can be turned on and off when desired. This control allows the location of specific molecules of interest to be detected by comparing images having the desired contrast present to those where it has been turned off. Lastly, the CEST imaging method is far more sensitive than traditional molecular MRI techniques, making it able to detect substantially low concentrations of given molecules.

A number of different molecular groups have been suggested for CEST studies. One such group are the amide protons. Amide protons are present in large numbers on peptides and proteins; therefore, amide proton CEST should be reflective of protein concentration in cells. However, other exchangeable protons are also targeted with CEST imaging methods. Exemplary exchangeable protons include those protons contained in hydroxyl and glycogen, as well as paramagnetic molecules in general. However, CEST MRI suffers from several limitations including long image acquisition times and the qualitative nature of the CEST contrast, which depends on many factors, including the chemical exchange rate, concentration of exchangeable protons, longitudinal relaxation time, and RF saturation power.

As suggested, CEST MRI is a sensitive imaging technique for detecting compounds containing exchangeable protons. Such labile protons can be selectively saturated by an RF pulse, and the saturation subsequently transferred to the bulk water signal via proton chemical exchange, resulting in substantial sensitivity enhancement. CEST imaging has been demonstrated in mapping low-concentration metabolites such as creatine (Cr), glucose, glutamate, and changes in microenvironment properties such as temperature and pH, promising a host of in vivo applications such as imaging of ischemic stroke and tumor.

Quantitative CEST MRI is typically performed by analyzing the Z-spectrum acquired through sweeping RF saturation around the bulk water resonance, offset by offset. In vivo CEST quantification remains challenging due to concomitant effects such as RF spillover (direct water saturation), semisolid macromolecular magnetization transfer (MT) and nuclear overhauser effects (NOE). As such, the conventional asymmetry analysis ($MTR_{asym}$), which has been widely used to suppress spillover and MT effects, measures a mixed contribution. Hence, resolving individual contributions is necessary. To avoid asymmetric MT effect, a three-offset approach that subtracts the label image from the average of two boundary images that have an equal offset shift from the label image was proposed to quantify amide proton transfer (APT) and NOE effects. However, the linear assumption underlying the three offset method is oversimplified, which likely underestimates the APT and NOE effects.

Recently, least-squares Z-spectral fitting approaches have been employed to resolve multi-pool contributions. The reliability of these approaches depends strongly on the signal-to-noise ratio (SNR), which may be compromised by spatiotemporal resolution. Thus, conventional least-squares Z-spectral fitting approaches tend to produce inaccurate results when the SNR is low, such as in the presence of noise. Moreover, conventional least-squares fitting is sensitive to the initial values and boundary values, which can lead to inaccurate fitting results, if not properly selected.

Therefore, given the above, there is a need in the art for systems and methods to improve the reliability of CEST MRI quantification and for the development of a fitting approach that can perform when SNR is suboptimal.

SUMMARY OF THE PRESENT DISCLOSURE

The present disclosure overcomes the aforementioned drawbacks by providing systems and methods for applying a fitting method to improve the reliability of in vivo CEST MRI quantification and, in particular, provides an image downsampling expedited adaptive least-squares (IDEAL) fitting method.

In one form, the method uses globally averaged Z-spectrum for initial fitting, which are more reliable given the high SNR and relaxed boundary constraints. The initial fitting results are then used as initial values for subsequent fitting of substantially downsampled images. The resolution of downsampled images is increased iteratively and fitted with the fitting results from the previous downsampled images as renewed initial values until the desired image resolution is reached. The performance of the proposed fitting method is evaluated against conventional methods using in vitro and in vivo studies. Improved performance of the proposed fitting method over conventional methods is affirmed by assessing both methods via coefficient of variation (COV, i.e., S.D./mean), contrast-to-noise ratio (CNR), goodness of fit and fitting speed.

In one aspect of the present disclosure, a method is provided for producing a quantitative chemical exchange saturation transfer (CEST) image of a subject. The method includes using a magnetic resonance (MR) system to perform a pulse sequence that saturates one or more labile spin species from a plurality of voxels in a region-of-interest (ROI) of the subject by applying a radiofrequency (RF) irradiation at a range of frequencies to generate chemical exchange saturation transfer (CEST) data. The method further includes using the MR system to acquire the CEST data to generate an initial Z spectra from the plurality of voxels within the ROI. A mask is then defined within the ROI that includes at least one voxel from the plurality of voxels, and a fitting method is performed on one or more Z spectrum within the mask to generate initial fitted values. An initial downsampled Z spectral image is then generated based on the initial fitted values. The method proceeds by iteratively increasing the image resolution of the initial downsampled Z spectral image based on updated fitted values obtained from fitting a previous iteration, wherein the steps of fitting the previous iteration and increasing the image resolution are repeated until a final Z spectral is produced that comprises a desired image resolution. The method further includes generating a quantitative image of the ROI of the subject based on the final Z spectral image.

In another aspect of the present disclosure, a method is provided for using a magnetic resonance (MR) system to determine quantitative chemical exchange or exchangeable proton information from a region-of-interest (ROI) in a subject. The method includes using a magnetic resonance (MR) system to perform a pulse sequence that saturates one or more labile spin species from a plurality of voxels in a region-of-interest (ROI) of the subject by applying a radiofrequency (RF) irradiation at a range of frequencies to generate chemical exchange saturation transfer (CEST) data. The method further includes using the MR system to acquire the CEST data from a plurality of voxels in the ROI. The method proceeds by generating an initial downsampled Z spectrum matrix based on initial fitted values. The initial fitted values may be obtained by defining a mask that includes at least one voxel or a plurality of voxels within the ROI and performing a fitting method on one or more Z spectrum within the mask to generate the initial fitted values. The method further includes fitting the initial downsampled Z spectrum matrix using the fitting method to obtain updated fitted values, and generating an updated Z spectrum matrix using the updated fitted values, where the updated Z spectrum matrix is larger than the initial downsampled Z spectrum matrix. The method proceeds by iteratively increasing the size of the updated downsampled Z spectrum matrix based on the updated fitted values obtained from a previous iteration until a final Z spectrum matrix is generated having a desired matrix size. At least one quantitative CEST parameter is then determined from the ROI of the subjected based on the final Z spectrum matrix.

In one aspect, a magnetic resonance (MR) system is provided. The MR system comprises a magnet system configured to generate a polarizing magnetic field about at least a portion of a subject arranged in the MR system, and a magnetic gradient system including a plurality of magnetic gradient coils configured to apply at least one magnetic gradient field to the polarizing magnetic field. The MR system further includes a radio frequency (RF) system configured to apply an RF field to the subject and to receive magnetic resonance signals from the subject using a coil array. The MR system further comprises a computer system that is programmed to: (i) control the magnetic gradient system and RF system to perform a pulse sequence that saturates one or more labile spin species in a plurality of voxels within a region-of-interest (ROI) in the subject to generate chemical exchange saturation transfer (CEST) data, and acquire the CEST data to generate an initial Z spectra from the plurality of voxels within the ROI; (ii) define a mask within the ROI that includes at least one voxel and performing a fitting method on one or more Z spectrum within the mask to generate initial fitted values; (iii) generate an initial downsampled Z spectral image based on the initial fitted values; (iv) fit the downsampled Z spectral image using the fitting method to obtain updated fitted values; (v) increase the image resolution of the initial downsampled Z spectral image based on the updated fitted values to generate an updated Z spectral image; (vi) iteratively repeat the steps of fitting the updated Z spectral image and increasing the image resolution of the updated Z spectral image using the updated fitted values from a previous iteration to generate higher resolution updated Z spectral images until a desired image resolution is achieved; and (vii) generate and display a quantitative image of the ROI of the subject having the desired image resolution.

The foregoing and other advantages of the present disclosure will appear from the following description.

BRIEF DESCRIPTION OF THE DRAWINGS

The patent or patent application file contains at least one drawing in color. Copies of this patent or patent application publication with color drawings will be provided by the Office upon request and payment of the necessary fee.

FIG. 7A provides a comparison of fitted amplitudes from conventional fitting and "IDEAL" fitting under different noise levels in a phantom with two compartments containing different concentrations of amide and Cr.

FIG. 7B shows fitted amplitudes of amide in each compartment of FIG. 7A plotted as a function of standard deviation of added Gaussian noise ($\sigma$).

FIG. 7C shows fitted amplitudes of Cr in each compartment of FIG. 7A plotted as a function of standard deviation of added Gaussian noise ($\sigma$).

DETAILED DESCRIPTION OF THE PRESENT DISCLOSURE

Figure 1:
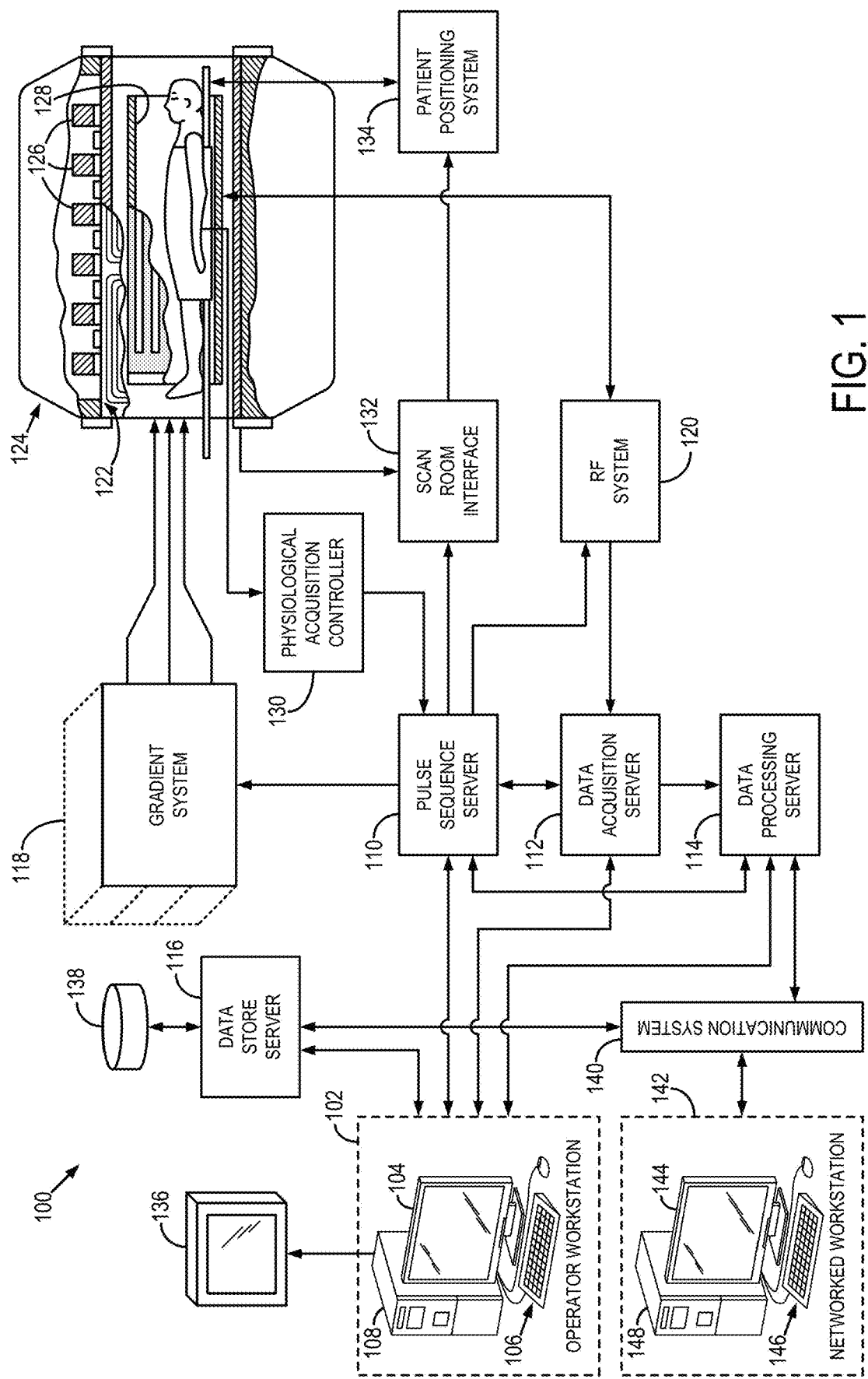
FIG. 1 is a block diagram of an example magnetic resonance imaging ("MRI") system that can implement methods described herein.

Referring particularly now to FIG. 1, an example of a magnetic resonance imaging ("MR") or nuclear magnetic resonance (NMR) system 100 that can implement the methods described herein is illustrated. The MR system 100 includes an operator workstation 102 that may include a display 104, one or more input devices 106 (e.g., a keyboard, a mouse), and a processor 108. The processor 108 may include a commercially available programmable machine running a commercially available operating system. The operator workstation 102 provides an operator interface that facilitates entering scan parameters into the MR system 100. The operator workstation 102 may be coupled to different servers, including, for example, a pulse sequence server 110, a data acquisition server 112, a data processing server 114, and a data store server 116. The operator workstation 102 and the servers 110, 112, 114, and 116 may be connected via a communication system 140, which may include wired or wireless network connections.

The pulse sequence server 110 functions in response to instructions provided by the operator workstation 102 to operate a gradient system 118 and a radiofrequency ("RF") system 120. Gradient waveforms for performing a prescribed scan are produced and applied to the gradient system 118, which then excites gradient coils in an assembly 122 to produce the magnetic field gradients $G_x$, $G_y$, and $G_z$ that are used for spatially encoding magnetic resonance signals. The gradient coil assembly 122 forms part of a magnet assembly 124 that includes a polarizing magnet 126 and a whole-body RF coil 128.

RF waveforms are applied by the RF system 120 to the RF coil 128, or a separate local coil to perform the prescribed magnetic resonance pulse sequence. Responsive magnetic resonance signals detected by the RF coil 128, or a separate local coil, are received by the RF system 120. The responsive magnetic resonance signals may be amplified, demodulated, filtered, and digitized under direction of commands produced by the pulse sequence server 110. The RF system 120 includes an RF transmitter for producing a wide variety of RF pulses used in MR pulse sequences. The RF transmitter is responsive to the prescribed scan and direction from the pulse sequence server 110 to produce RF pulses of the desired frequency, phase, and pulse amplitude waveform. The generated RF pulses may be applied to the whole-body RF coil 128 or to one or more local coils or coil arrays.

The RF system 120 also includes one or more RF receiver channels. An RF receiver channel includes an RF preamplifier that amplifies the magnetic resonance signal received by the coil 128 to which it is connected, and a detector that detects and digitizes the I and Q quadrature components of the received magnetic resonance signal. The magnitude of the received magnetic resonance signal may, therefore, be determined at a sampled point by the square root of the sum of the squares of the I and Q components:

$$M=\sqrt{I^2+Q^2} \tag{1};$$

and the phase of the received magnetic resonance signal may also be determined according to the following relationship:

$$\varphi = \tan^{-1}\left(\frac{Q}{I}\right). \tag{2}$$

The pulse sequence server 110 may receive patient data from a physiological acquisition controller 130. By way of example, the physiological acquisition controller 130 may receive signals from a number of different sensors connected to the patient, including electrocardiograph ("ECG") signals from electrodes, or respiratory signals from a respiratory bellows or other respiratory monitoring devices. These signals may be used by the pulse sequence server 110 to synchronize, or "gate," the performance of the scan with the subject's heart beat or respiration.

The pulse sequence server 110 may also connect to a scan room interface circuit 132 that receives signals from various sensors associated with the condition of the patient and the magnet system. Through the scan room interface circuit 132, a patient positioning system 134 can receive commands to move the patient to desired positions during the scan.

The digitized magnetic resonance signal samples produced by the RF system 120 are received by the data acquisition server 112. The data acquisition server 112 operates in response to instructions downloaded from the operator workstation 102 to receive the real-time magnetic resonance data and provide buffer storage, so that data is not lost by data overrun. In some scans, the data acquisition server 112 passes the acquired magnetic resonance data to the data processor server 114. In scans that require information derived from acquired magnetic resonance data to control the further performance of the scan, the data acquisition server 112 may be programmed to produce such information and convey it to the pulse sequence server 110. For example, during pre-scans, magnetic resonance data may be acquired and used to calibrate the pulse sequence performed by the pulse sequence server 110. As another example, navigator signals may be acquired and used to adjust the operating parameters of the RF system 120 or the gradient system 118, or to control the view order in which k-space is sampled. In still another example, the data acquisition server 112 may also process magnetic resonance signals used to detect the arrival of a contrast agent in a magnetic resonance angiography ("MRA") scan. For example, the data acquisition server 112 may acquire magnetic resonance data and processes it in real-time to produce information that is used to control the scan.

The data processing server 114 receives magnetic resonance data from the data acquisition server 1312 and processes the magnetic resonance data in accordance with instructions provided by the operator workstation 102. Such processing may include, for example, reconstructing two-dimensional or three-dimensional images by performing a Fourier transformation of raw k-space data, performing other image reconstruction algorithms (e.g., iterative or backprojection reconstruction algorithms), applying filters to raw k-space data or to reconstructed images, generating functional magnetic resonance images, or calculating motion or flow images.

Images reconstructed by the data processing server 114 are conveyed back to the operator workstation 102 for storage. Real-time images may be stored in a data base memory cache, from which they may be output to operator display 102 or a display 136. Batch mode images or selected real time images may be stored in a host database on disc storage 138. When such images have been reconstructed and transferred to storage, the data processing server 114 may notify the data store server 116 on the operator workstation 102. The operator workstation 102 may be used by an operator to archive the images, produce films, or send the images via a network to other facilities.

The MR system 100 may also include one or more networked workstations 142. For example, a networked workstation 142 may include a display 144, one or more input devices 146 (e.g., a keyboard, a mouse), and a processor 148. The networked workstation 142 may be located within the same facility as the operator workstation 102, or in a different facility, such as a different healthcare institution or clinic.

The networked workstation 142 may gain remote access to the data processing server 114 or data store server 116 via the communication system 140. Accordingly, multiple networked workstations 142 may have access to the data processing server 114 and the data store server 116. In this manner, magnetic resonance data, reconstructed images, or other data may be exchanged between the data processing server 114 or the data store server 116 and the networked workstations 142, such that the data or images may be remotely processed by a networked workstation 142.

As will be described, the above MR system 100 may be used to measure chemical exchange saturation transfer (CEST) data in accordance with the methods of the present disclosure. Briefly, measuring the exchange of magnetization between molecules with nuclear magnetic resonance can provide unique information about the chemical and molecular environment of samples or tissues. CEST imaging renders MRI, which usually detects only bulk water signal, sensitive to metabolites and their byproducts, such as glucose and lactate. The CEST imaging method is built upon the method of conventional magnetization transfer. The CEST contrast is achieved by the selective irradiation of labile protons, which in turn attenuate the bulk water signal through saturation transfer. Labile protons are saturated using either an off-resonance pulse or continuous wave of RF irradiation. This saturation process is known as "RF labeling" or simply "labeling". It is the transfer of this saturation through chemical exchanges between the exchangeable and water protons that forms the basis of CEST imaging methods.

In particular, frequency-dependent saturation effects are visualized similar to conventional magnetization transfer (MT) spectra by plotting the water saturation, often normalized by the signal without saturation, as a function of saturation frequency. This gives what has been dubbed a "Z spectrum" or the "CEST spectrum."

The size of the CEST effect is determined by how quickly the protons exchange their magnetization with water. This exchange rate is believed to be determined by pH, so the CEST effect can also potentially provide information indicative of altered pH levels. The chemical exchange between bulk water and amide protons from endogenous proteins and peptides has been shown to be sensitive to ischemic tissue acidosis, and as a result has given rise to an imaging technique referred to as amide proton transfer (APT) imaging. Conventional APT imaging methods are described, for example, by J. Zhou, et al., in "Using the Amide Proton Signals of Intracellular Proteins and Peptides to Detect pH Effects in MRI," Nature Medicine, 2003; 9:1085-1090, and in U.S. Pat. No. 6,943,033. Since tissue pH decreases in response to abnormal glucose/oxygen metabolism during acute ischemia, pH-sensitive APT imaging may serve as a surrogate metabolic imaging marker for stroke. In that it complements perfusion and diffusion MRI, APT imaging may allow better characterization of penumbra for predicting ischemic tissue outcome in acute stroke. Moreover, APT imaging may eventually help guide thrombolytic and/or neuroprotective therapies for acute stroke.

Figure 2A:
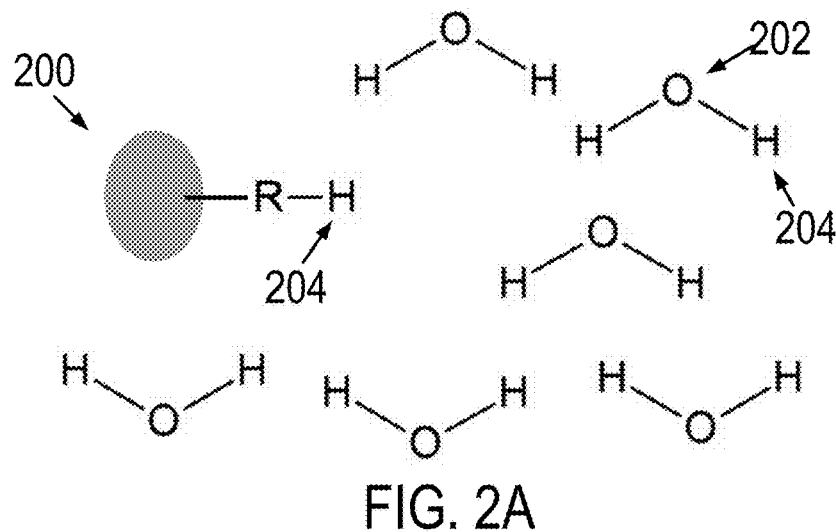
FIG. 2A is a schematic illustration of a small quantity of metabolite dissolved in a solvent, where each of the metabolite and the solvent include exchangeable protons in chemical exchange.
Figure 2B:
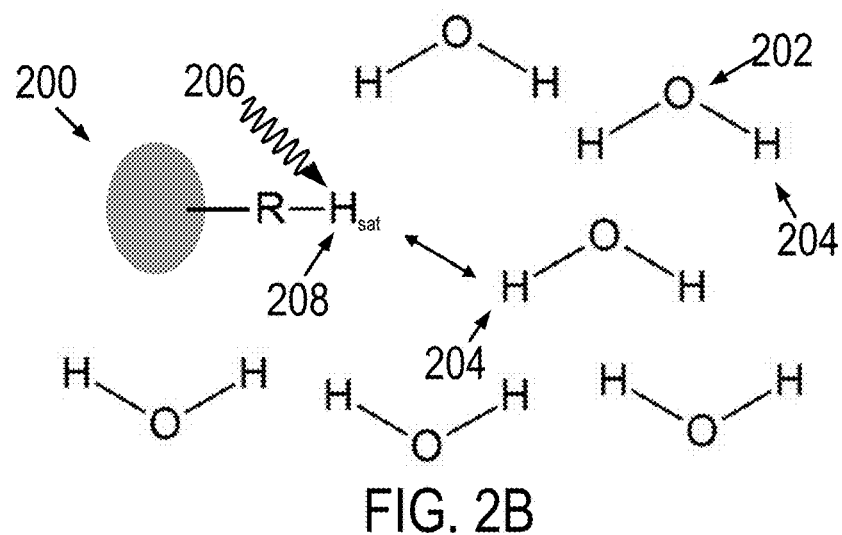
FIG. 2B is a schematic illustration of an RF pulse being applied to the exchangeable proton on the metabolite to form a saturated proton, where the saturated proton is in chemical exchange with the solvent.
Figure 2C:
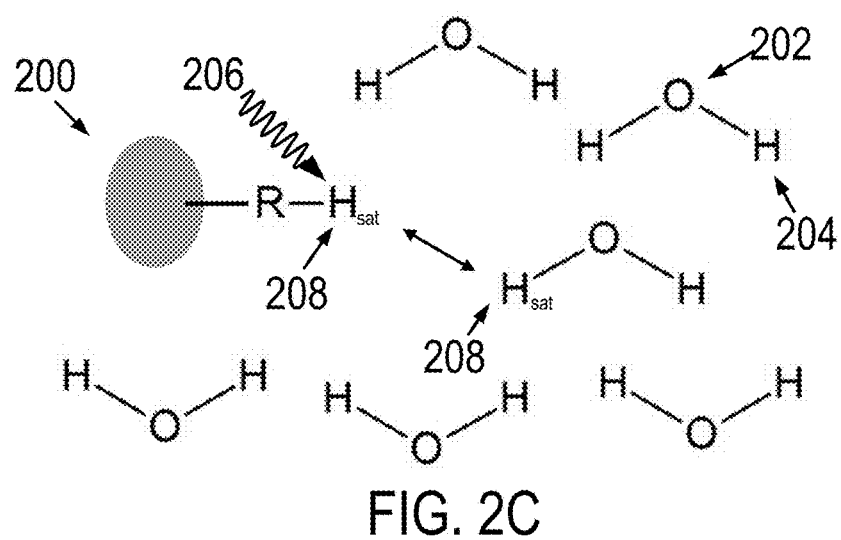
FIG. 2C is a schematic illustration of the saturated proton being transferred to the solvent resulting in a loss of solvent signal over time.

Referring now to FIGS. 2A-2C, a schematic illustration is shown to illustrate magnetization transfer via chemical exchange between a metabolite and a bulk solvent solution, which is exploited to achieve CEST contrast. FIG. 2A shows a metabolite 200 dissolved in a solvent 202 where both the metabolite 200 and the solvent 202 comprise an exchangeable proton 204. FIG. 2B shows an exchangeable proton 204 being selectively saturated by an RF pulse 206 to produce a saturated proton 208. Magnetic saturation will spontaneously be transferred to the solvent 202 overtime due to chemical exchange of the saturated proton 208 with the exchangeable protons 204. This process continues to produce a reduction in the solvent 102 signal over time, which may be detected using MR imaging. The loss of solvent 202 signal provides an indirect measure for the concentration of the metabolite 200 in the solution, which may be visualized from the variation in the solvent 202 signal as a function of offset frequency of the irradiation pulse, known as a Z-spectrum. CEST imaging has been demonstrated in mapping low-concentration endogenous metabolites 200 with exchangeable protons 204 such as metabolites 200 with amide (—NH), amine ($NH_2$) and hydroxyl (—OH) functional groups. Typically, the solvent 202 comprises water, but could conceivably be any solvent 202 that includes an exchangeable proton 204. CEST imaging has also been used to map dilute metabolites and to track changes in microenvironment properties such as temperature and pH, promising a host of in vivo applications such as imaging of ischemic stroke and tumor.

In addition to amide proton transfer (APT) imaging, a number of different molecular groups have been suggested for CEST studies. Exemplary exchangeable protons include those protons contained in hydroxyl and glycogen, as well as paramagnetic molecules in general. It will be appreciated by those skilled in the art that the herein described method is applicable not only to amide proton CEST, but also for CEST imaging techniques that utilize other molecular targets, such as glycogen ("glycoCEST"), hydroxyl proton CEST ("OH CEST"), and paramagnetic molecule CEST ("paraCEST"). The term "labile proton" or "exchangeable proton" herein refers to those proton or other molecular targets from which magnetization or saturation is desired to transfer to water protons during a CEST imaging scan.

For APT CEST, and many other CEST applications, a major difficulty arises when attempting to avoid other sources of signal change when saturation of the labile proton line is performed. For example, off-resonance saturation can cause direct saturation of the nearby water line, as well as magnetization transfer effects resulting in saturation of broad molecular lines that exchange magnetization with water.

Figure 3A:
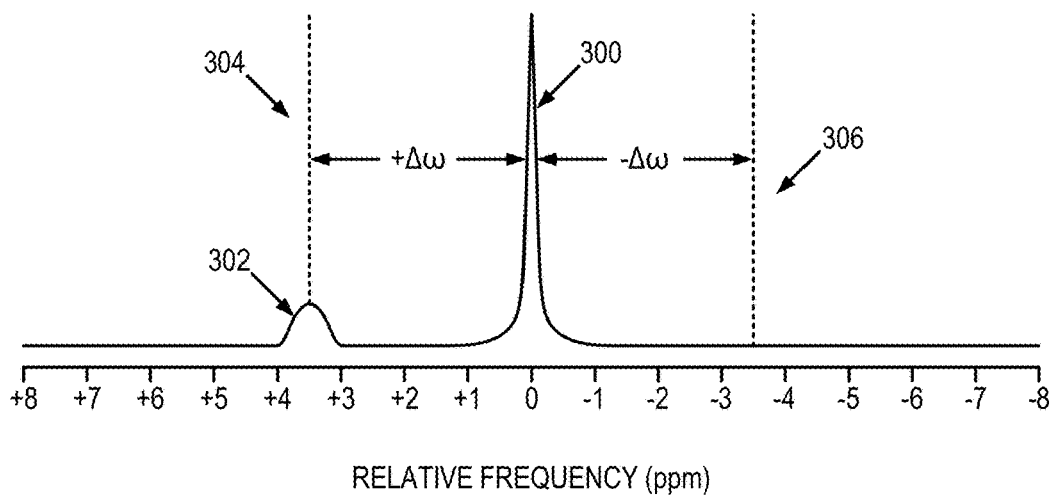
FIG. 3A is a graphic illustration of an exemplary frequency spectrum that includes a water proton resonance peak and an amide proton resonance peak.
Figure 3B:
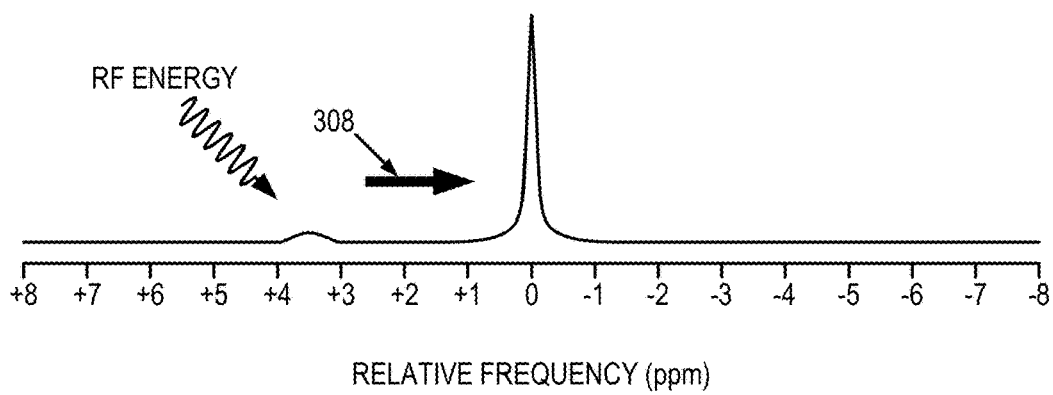
FIG. 3B is a graphic illustration of the effect of the application of radio frequency ("RF") energy at a labeling frequency that is around the resonance frequency of an exchangeable proton, such as an amide proton, on detectable signal from water protons adjacent the exchangeable proton.
Figure 3C:
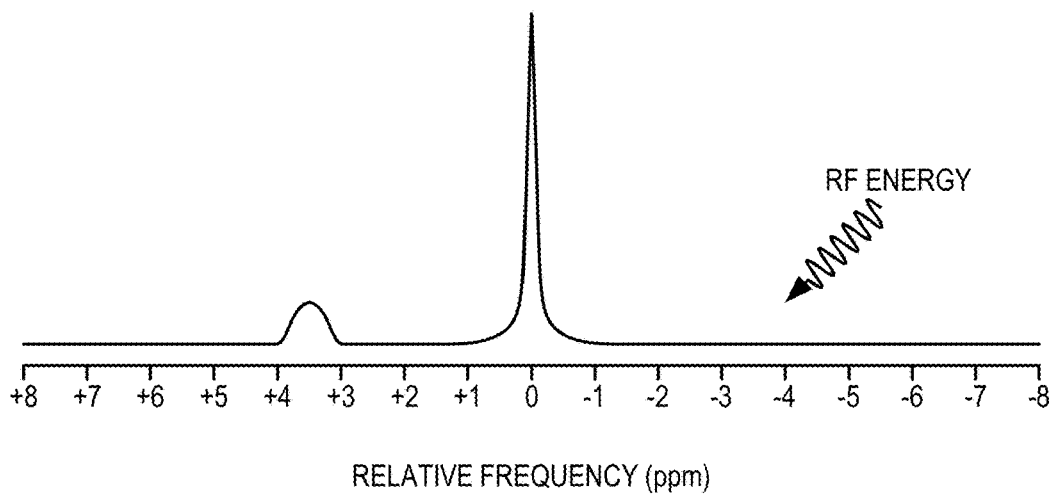
FIG. 3C is a graphic illustration of the effect of the application of RF energy at a reference frequency, equal to the negative of the labeling frequency, on detectable signal from water protons adjacent the exchangeable proton.

Referring now to FIGS. 3A-3C, a graphic illustration of an exemplary method for producing CEST Z spectrum is shown. An exemplary Z spectrum is illustrated in FIG. 3A, the spectrum including a spectral peak 300 corresponding to water protons and a spectral peak 302 corresponding to amide protons. The amide proton peak 302 exists at a frequency shift relative to the water peak 300. For example, there is a frequency shift of around +3.5 parts per million ("ppm") between the water peak 300 and the amide proton peak 302. Thus, a so-called "labeling spectral line" 304, or "labeling frequency," is centered at or around the resonance frequency of the exchangeable proton, which for an amide proton is shifted about +3.5 ppm relative to the water peak 300. In general, for CEST imaging, the labeling spectral line is selected as a frequency at or around the resonance frequency of the exchangeable proton. A so-called "reference spectral line" 306, or "reference frequency," also exists, and is equal to the negative of the labeling frequency relative to the water peak 300.

To obtain a Z spectrum, a series of image data is acquired with an MRI system by applying RF energy at the labeling spectral line changing incrementally, for example from down-field 304 to up-field 306 of water resonance. If the labeling spectral line is applied at the resonance frequency of the exchangeable proton, the saturation of the exchangeable protons is transferred through chemical exchange processes to nearby water protons, as indicated by line 308 in FIG. 3B. As a result, the detectable signal from these water protons is reduced. Referring now to FIG. 3C, there is no saturation transferred to the adjacent water spins and, therefore, no resultant decrease in detectable signal. In this manner, a so-called "Z spectrum" is acquired.

CEST experiments rely on the difference in CEST effect with the frequency of application. One common imaging approach is to compare an image with saturation applied at the frequency of the molecule of interest with another where the saturation is applied on the opposite side of the water frequency that is applied at the negative of the first frequency. This is successful only if the position of the water line is known exactly and if the magnetization transfer effect is symmetric around the water line. While these situations might be achievable in vitro, neither are present in vivo, thereby resulting in significant errors when utilizing the aforementioned approach.

An alternative is to obtain Z spectrum and fit the signal as a function of frequency to some model. The Z-spectrum is typically acquired through sweeping RF saturation around the bulk water resonance, offset by offset as described in FIGS. 3A-3C. Least-squares Z-spectral fitting approaches employing a multi-Lorentzian model have been employed to resolve multi-pool contributions. The reliability of these approaches depends strongly on the signal-to-noise ratio (SNR), which may be compromised by spatiotemporal resolution. This is important because in vivo CEST effect is subtle, typically a few percent, with concomitant RF saturation effects that are often non-negligible. Conventional techniques have tried to improve SNR by increasing the number of signal averages; however, this prolongs scan time, especially for Z-spectral acquisition. Moreover, conventional least-squares fitting is sensitive to the initial values and boundary values, which can lead to inaccurate fitting results due to arbitrary selection of initial values.

The present disclosure addresses these aforementioned drawbacks by providing a fitting model that harnesses the high SNR of downsampled images for iterative fitting to achieve reliable and improved CEST MRI quantification. The methods presented herein offer other advantages over conventional fitting methods such as minimizing operator bias by avoiding the arbitrary selection of initial values, which enables automated, adaptive fitting for reliable estimation of CEST effects.

Figure 4:
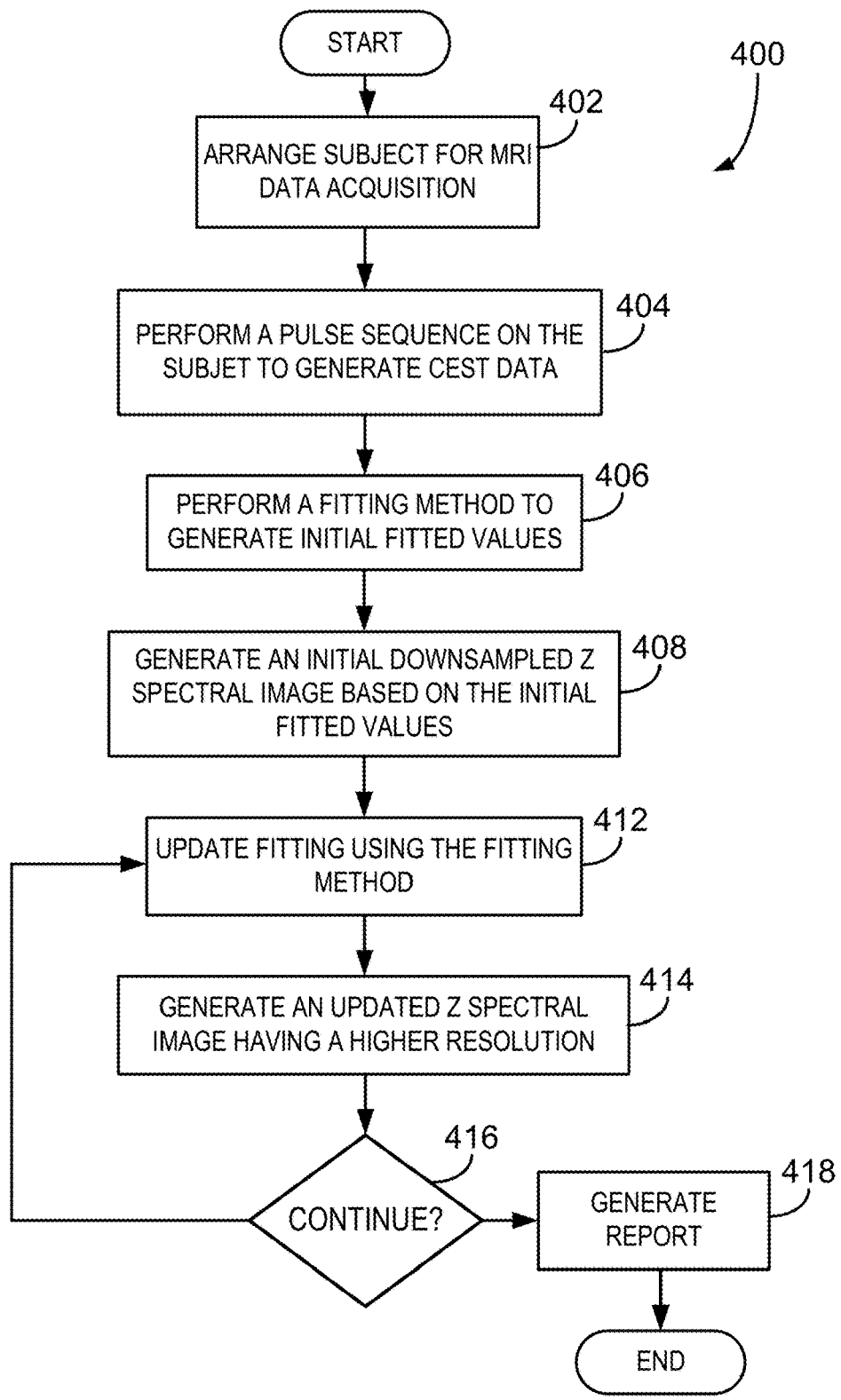
FIG. 4 is a flowchart setting forth the steps of an example method for "Image Downsampling Expedited Adaptive Least-squares" ("IDEAL") fitting for magnetic resonance ("MR") images. For convenience, "IDEAL" may be used as shorthand corresponding with certain exemplary implementations of the systems and methods being discussed.

Referring to FIG. 4, a flow chart is provided that provides some, non-limiting example steps of a process 400 for applying Image Downsampling Expedited Adaptive Least-squares (IDEAL) fitting to produce a chemical exchange saturation transfer (CEST) image of a subject in accordance with the present disclosure. The process 400 beings at process block 402 by arranging the subject in a magnetic resonance (MR) system capable of acquiring MR data from a region-of-interest of the subject, such as system 100 described in FIG. 1. As indicated at 404, a pulse sequence is performed by the MR system to generate CEST data from the subject. For example, the pulse sequence 404 may be configured to saturate labile spin species from the region-of-interest by applying a radiofrequency (RF) irradiation at a range of frequencies to generate the CEST data. The pulse sequence 404 is further configured with an acquisition window that acquires the CEST data to generate an initial Z-spectra from the plurality of voxels within the region-of-interest. The RF irradiation is typically applied in increments or offset by offset.

In some aspects, process block 404 may include further processing steps, for example, the CEST data or Z-spectrum may be interpolated by smoothing splines, corrected for field inhomogeneity (e.g. using a WASSR map), and normalized by the signal without RF irradiation. In some aspects, parametric maps such as T1-weighted or T2-weighted images may be generated for the region-of-interest to assist in identifying tissues within the region-of-interest, such as tumors.

The process 400 further includes using the MR system 100 to perform a fitting method to generate initial fitting values for subsequent fitting as indicated by process block 406. In some aspects, process block 406 further includes defining a mask within the image region-of-interest (e.g., phantom, brain, abdomen, etc) that includes at least one voxel and performing a fitting method on a Z spectrum within the mask to generate the initial fitted values. In other forms, rather than using a single voxel, the mask may be defined such that it includes a plurality of voxels within the region-of-interest and the initial fitted values may be generated by averaging Z spectra (i.e., multiple Z spectrum) from within the mask to produce a global Z spectrum. Generating the global Z spectrum may offer the advantage of generating a higher signal to noise ratio, which improves the accuracy of initial fitted values for subsequent fitting results. A suitable fitting method for process 400 may include a Lorentzian-based function such as a multi-pool Lorentzian model. The fitting method may be used to estimate the CEST effects from different proton pools of the initial Z spectra on a voxel-wise basis. Briefly, the Z spectrum can be fitted as the sum of multiple Lorentzian functions using the following equation:

$$1 - \frac{I}{I_0} = \sum_{i=1}^{N} \frac{A_i}{1 + 4\left(\frac{\omega - \omega_i}{\sigma_i}\right)^2};\quad (3)$$

where $\omega$ is the frequency offset from the water resonance, $A_i$, $\omega_i$ and $\sigma_i$ are the amplitude, frequency offset, and linewidth, respectively, of the CEST peak for the proton pool i. In some aspects, the fitting model in process 400 is constrained by a set of boundary conditions to improve processing efficiency. For example, using the fitting model to determine the initial fitted parameters may include constraining the fitting model with a set of boundary conditions defined by 10% and 10 times of the amplitude and linewidth of each proton pool, and ±20% of the corresponding linewidth for frequency offset of each proton pool.

Referring back to FIG. 4, the initial fitted values obtained from process block 406 may then be used to generate an initial downsampled Z spectrum at process block 408. The initial downsampled Z spectrum may comprise, for example, a smaller Z spectrum matrix or a Z spectral image having a lower resolution than the initial Z spectra. Generating a downsampled Z spectral image offers the benefit of achieving a higher spectral SNR, which can be exploited in subsequent voxel-wise fitting. As indicated generally at process block 412, the initial downsampled Z spectrum may then be fit using the fitting model to obtain updated fitting values, which are then used at process block 414 to generate an updated downsampled Z spectral matrix or image having an increased matrix size (spectral resolution) or a higher image resolution. Similar to the initial fitted values, the updated fitted values may also be constrained by a set of boundary conditions to improve processing efficiency. The boundary conditions may be the same or they may be different. For example, using the fitting model to determine the updated fitted values may include constraining the fitting model with a set of boundary conditions defined by ±10% of the amplitude and linewidth of each proton pool, and ±5% of the corresponding linewidth for frequency offset of each proton pool.

After process block 414, a check is made at decision block 416 to determine if process blocks 412-414 should be repeated. In one aspect, decision block 416 includes an assessment performed by the MR system 100 to determine whether the image resolution or the matrix size of the updated downsampled Z spectral image or matrix meets a pre-determined value. The pre-determined value may be, for example, the original CEST image resolution or the original matrix size of the initial Z spectra or a desired matrix size or image resolution. If the predetermined value is not met, process blocks 412-414 are repeated iteratively to increase the matrix size or image resolution of the updated downsampled Z spectral image or matrix based on updated fitted values obtained from a previous iteration. If the updated downsampled Z spectral image or matrix does meet the pre-determined value, a final Z spectrum is elected and may be used to generate a report at process block 418. In one aspect, generating the report may include generating a quantitative image of the region-of-interest of the subject based on the final Z spectral image. In another aspect, generating the report may include determining at least one quantitative CEST parameter from the ROI of the subject based on the final Z spectrum matrix.

Suitable images generated by the report may include a quantitative image selected from an amide proton transfer image, an amine proton transfer image, a magnetization transfer (MT) image, a nuclear overhauser effect (NOE) image, a blood oxygenation level dependent (BOLD) image, a dynamic contrast-enhanced (DCE) image, and a dynamic susceptibility contrast (DSC) image. In some aspects, the MR system 100 may further display a tumor as hyperintense within the region-of-interest in the amide or NOE images.

The following examples set forth, in detail, ways in which the present disclosure may be used or implemented, and will enable one of ordinary skill in the art to more readily understand the principles thereof. The following examples are presented by way of illustration and are not meant to be limiting in any way.

In Vitro CEST phantom studies were performed with two vials containing different concentrations of mixed creatine and nicotinamide in $CuSO_4$-doped (1.5 mM) phosphate buffered solution (Sigma Aldrich, St Louis, Mo.). The concentration of creatine in the two vials was 50 mM and 100 mM and that of nicotinamide was 100 mM and 50 mM; pH was titrated to 7.0 (EuTech Instrument, Singapore). The vials were then sealed and inserted into a 50 ml falcon tube filled with 1.5% low gelling-point agarose.

In Vivo tumor model studies were performed on animals in accordance with institutional guidelines, as approved by the Institutional Animal Care and Use Committees (IACUC), Massachusetts General Hospital. For example, $2\times10^5$ cells of the non-infiltrating D74-rat glioma model were injected into the right frontal lobe of adult male Fischer 344 rats (N=8). The animals were imaged 11-13 days after tumor implantation.

MRI scans for both studies were performed on a 4.7 Tesla small-bore scanner (Bruker Biospec, Ettlingen, Germany). For the phantom study, CEST MRI was obtained with single-slice, single-shot echo planar imaging (EPI) (field of view (FOV)=52×52 mm2, matrix=96×96, slice thickness=10 mm). Z-spectrum was acquired from −5 ppm to 5 ppm with intervals of 0.125 ppm and RF irradiation power level of 1 μT. The repetition time (TR)/saturation time (TS)/echo time (TE) was 10 s/5 s/45 ms, number of average (NSA)=1, and the total scan time was 13 min 40 s. For the rodent study, multi-slice MRI (FOV=20×20 mm2, matrix=64×64, 5 slices, slice thickness/gap=1.8/0.2 mm) was acquired with single-shot EPI. Z-spectrum were obtained from −6 ppm to 6 ppm with intervals of 0.25 ppm and RF irradiation power level of 0.75 μT, TR/TS/TE=10 s/5 s/15 ms, NSA=2 and scan time=8 min 20 s. In addition, T1-weighted images were acquired with seven inversion delays ranging from 250 ms to 3,000 ms (TR/TE=6,500/28 ms, NSA=4); T2-weighted images were obtained with two TE of 30 and 100 ms (TR=3,250 ms, NSA=16).

Data were processed in MATLAB (MathWorks, Natick, Mass.). T1w and T2w parametric maps were obtained with least-squares mono-exponential fitting of the signal intensities as a function of inversion time and TE, respectively. Z-spectra (I) were interpolated by smoothing splines, corrected for field inhomogeneity using a WASSR map and normalized by the signal without RF irradiation ($I_0$). A conventional fitting method was also generated for comparison with the IDEAL process 400. The conventional fitting method included a multi-pool Lorentzian fitting of the Z-spectra on a voxel basis was applied to estimate the CEST effects from different pools using Eqn. 3.

In the CEST phantom, the IDEAL process 400 was employed in a five-pool Lorentzian model, including water (0 ppm), magnetization transfer (MT, −2 ppm), amide proton (3.5 ppm), creatine guanidinium proton (1.9 ppm) and hydroxyl proton (—OH, 1 ppm). Note the frequency offset of each pool was used as initial fitted values for fitting. For the in vivo study of rat gliomas, a six-pool Lorentzian model of water (0 ppm), MT (−2 ppm), amide (3.5 ppm), amine (2 ppm) and Nuclear Overhauser enhancement (NOE) effects at 3.5 ppm and 1.6 ppm upfield from water was used as initial fitted values for fitting.

The conventional fitting was constrained by bounds between 10% and 10 times of the initial values for amplitude and linewidth, and ±20% of the corresponding linewidth for frequency offset of each proton pool. Briefly, a global Z-spectrum was first obtained using the IDEAL process 400 by averaging the Z-spectra from all voxels within the mask. Multi-pool Lorentzian fitting of the global Z-spectrum with the same loosely constrained bounds as the conventional fitting was used to determine initial values for subsequent fine fitting. The field inhomogeneity-corrected CEST images were downsampled to 4×4 for voxel-wise multi-pool Lorentzian fitting, with the initial values of each voxel determined by the fitted values of the global Z-spectrum and tightly constrained bounds of ±10% the initial values for amplitude and linewidth, and ±5% of the corresponding linewidth for frequency offset. The same procedure was repeated sequentially for the CEST images downsampled to 8×8, 16×16, 32×32, etc., till the original image size of 96×96 or 64×64, with the initial values of each voxel determined by interpolating the fitted amplitude/linewidth/offset maps of the last downsampled images. For both fitting methods, the quality of fitting was evaluated by (1) coefficient of variation (COV, i.e., standard deviation/mean) within the mask in the fitted amplitude maps, (2) contrast-to-noise ratio (CNR) in the fitted amplitude maps between the two vials in the phantom or between the normal and tumor regions calculated by:

$$CNR = \frac{S_1 - S_2}{\sqrt{(\sigma_1^2 + \sigma_2^2)}}; \quad (4)$$

where $S_1$ and $S_2$ are the mean values for the two regions-of-interest (ROIs) respectively, and $\sigma_1$ and $\sigma_2$ are their standard deviations; and 3) goodness of fit ($R^2$) maps. The ROIs of tumor tissues were defined based on the distinct information from T1w and T2w maps and mirrored to the contralateral hemisphere for the ROIs of normal tissues. To evaluate the performance of the fitting methods under noise, different levels of Gaussian noise, with standard deviation a ranging from 0.005 to 0.1, can be added to the original phantom data with high signal-to-noise ratio (SNR) and before fitting.

Results: the present disclosure proposes an Image Downsampling Expedited Adaptive Least-squares (IDEAL) fitting process 400 to improve the reliability of in vivo CEST MRI quantification. FIG. 4 shows the flow chart of the proposed fitting method. Specifically, it uses globally averaged Z-spectrum for initial fitting, which are more reliable given the high SNR and relaxed boundary constraints. The initial fitting results are then used as initial values for subsequent fitting of substantially downsampled images. The resolution of downsampled images is increased iteratively and fitted with the fitting results from the previous downsampled images as renewed initial values until the desired image resolution is reached (illustrated in FIG. 5). As will be described, the IDEAL fitting process 400 is evaluated against conventional voxel-wise fitting in a CEST phantom superimposed with different levels of simulated noise. The fitting quality of both methods were assessed via coefficient of variation (COV, i.e., S.D./mean), contrast-to-noise ratio (CNR), goodness of fit and fitting speed. The IDEAL fitting process 400 was then applied to in vivo studies, and quantified the complex CEST effects in a rat model of glioma, demonstrating the advantage of the proposed IDEAL fitting algorithm.

Figure 5:
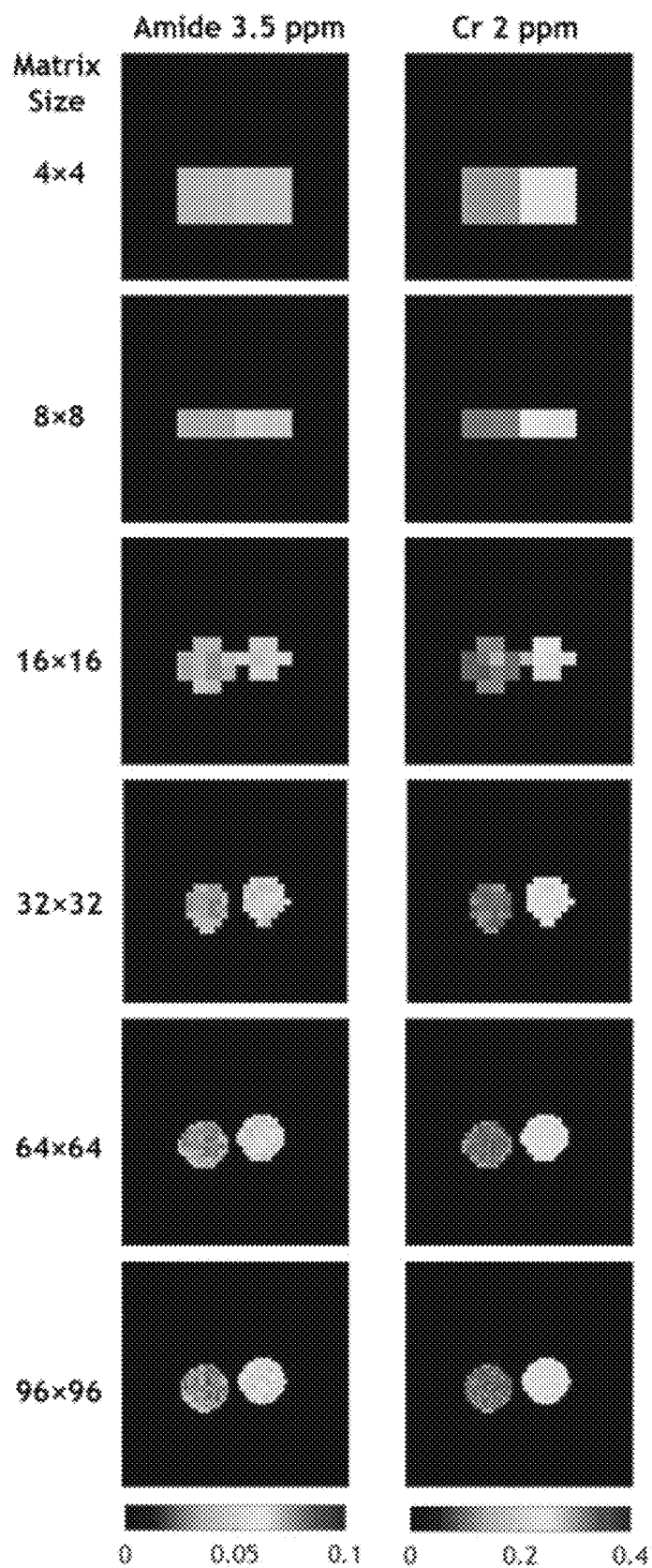
FIG. 5 shows the intermediate fitting results of iteratively less downsampled images from a two-compartment CEST phantom.
Figure 6A:
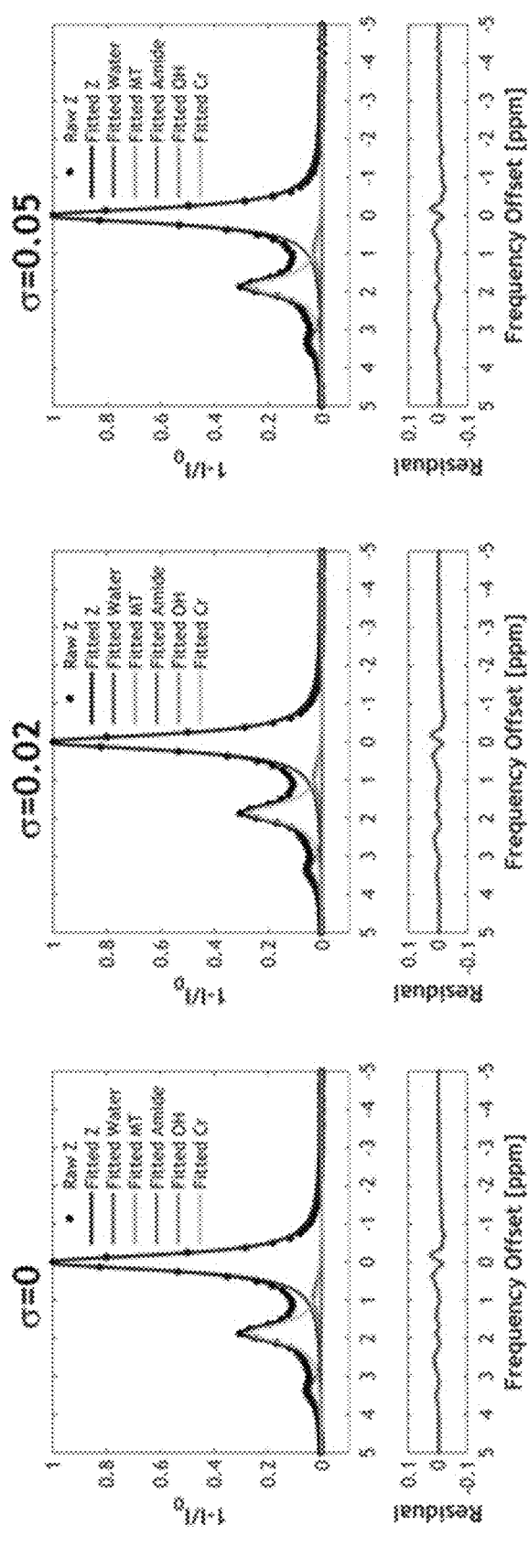
FIG. 6A provides a comparison of conventional voxel-wise multi-pool Lorentzian fitting versus "IDEAL" fitting in the two-compartment phantom (left: 50 mM Creatine (Cr) and 100 mM nicotinamide (amide); right: 100 mM Cr and 50 mM amide) with different levels of Gaussian noise ($\sigma$) added. Multi-pool Lorentzian fit of the global Z spectra at different noise levels may be used in determining initial values for "IDEAL" fitting. The global Z spectrum was obtained by averaging the Z spectra of all voxels within the phantom.
Figure 6B:
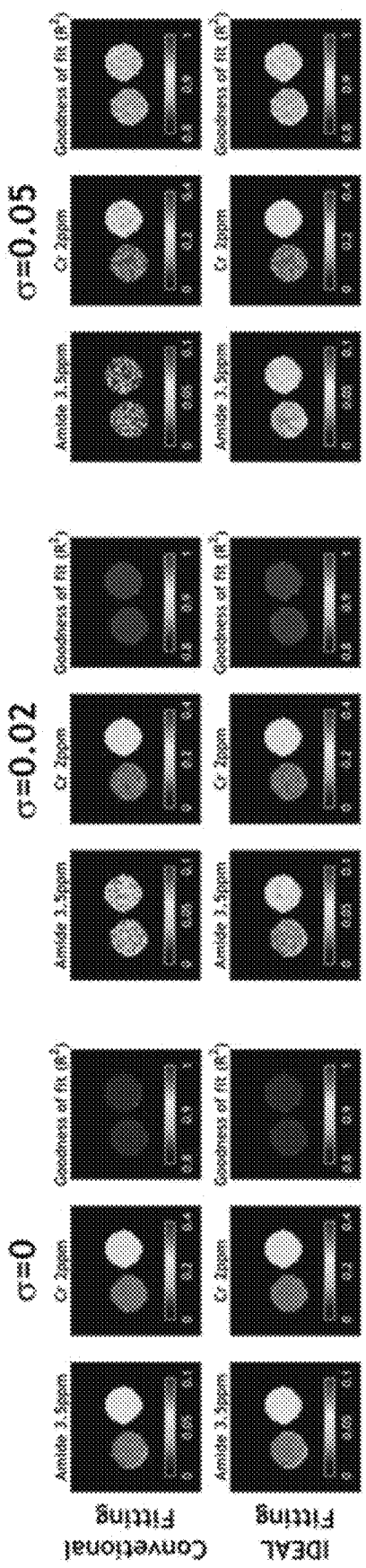
FIG. 6B depicts fitted amide and Cr maps using conventional fitting as compared with "IDEAL" fitting. The corresponding $R^2$ maps are shown.

FIG. 5 illustrates the intermediate fitting results of iteratively less downsampled images from a two-compartment CEST phantom using an exemplary "IDEAL" fitting process 400. FIGS. 6A and 6B compare the exemplary "IDEAL" fitting with conventional fitting in the CEST phantom. The same initial values and boundary values were used in conventional fitting and in the fitting of global Z-spectrum (FIG. 6A) for determination of initial values in the "IDEAL" fitting approach. The global-Z spectrum was obtained by averaging the Z-spectra of all voxels within the phantom so it had substantially higher SNR than that of individual voxel. Consequently, the fitted CEST peaks of the global Z-spectrum were similar in amplitude, offset, and linewidth without ($\sigma=0$) or with added noise ($\sigma=0.02$ and $0.05$). Without added noise, the fitted amide and creatine (Cr) amplitude maps using conventional fitting and "IDEAL" fitting process 400 were comparable (FIG. 6B). Both methods showed high $R^2$ maps. However, significant amount of noise appeared in the amplitude maps obtained from the conventional fitting after Gaussian noise superposition, indicating it's more susceptible to SNR degradation than the exemplary "IDEAL" fitting process 400.

Figure 8A:
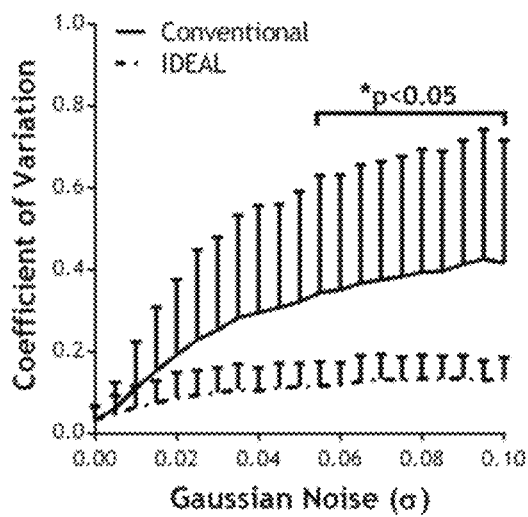
FIG. 8A provides a comparison of fitting quality of conventional fitting and "IDEAL" fitting in the phantom, in terms of coefficient of variation (COV, defined as standard deviation divided by mean, or SD/mean) in the fitted amplitude maps. Paired Student's t-test was performed between the two methods.
Figure 8B:
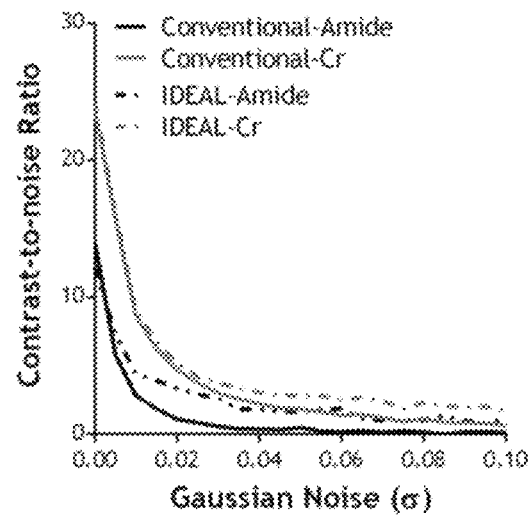
FIG. 8B provides a comparison of fitting quality of conventional fitting and "IDEAL" fitting in the phantom, in terms of contrast-to-noise ratio (CNR) between the two compartments in the fitted amide and Cr amplitude maps.
Figure 8C:
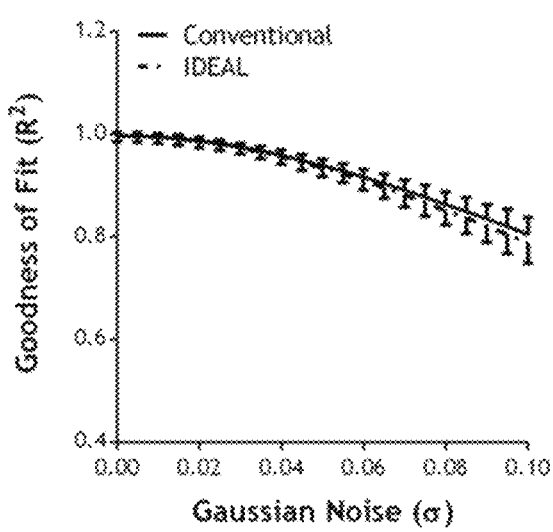
FIG. 8C provides a comparison of fitting quality of conventional fitting and "IDEAL" fitting in the phantom, in terms of $R^2$ as a function of noise level ($\sigma$).
Figure 8D:
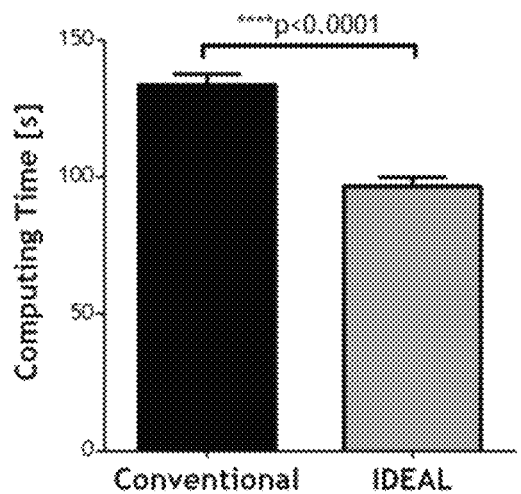
FIG. 8D provides a comparison of fitting quality of conventional fitting and "IDEAL" fitting in the phantom, in terms of computing time. Paired Student's t-test was performed between the two methods.

The performance of the "IDEAL" fitting process 400 was further evaluated under varied noise level (FIGS. 7A-C and 8A-D). No significant difference was found in the fitted amplitudes of amide and Cr peaks between conventional fitting and "IDEAL" process 400 in the absence of simulated noise, and the results were used as the reference for further comparison. For the conventional fitting, the derived amplitudes increasingly deviated from the reference as the simulated noise level increased (FIGS. 7A, 7B, 7C). In contrast, the "IDEAL" fitting process 400 provided much more stable results, showing smaller deviation from the reference (P<0.0001, paired t-test) with smaller SDs (P<0.0001, paired t-test). For both fitting methods, the coefficient of variation (COV) in the fitted amplitude maps increased with the added noise level (FIG. 8A). However, the COV using "IDEAL" fitting process 400 was generally less affected by the noise and it was significantly smaller than that of conventional fitting for $\sigma>0.055$. The contrast-to-noise ratio (CNR) between the two vials diminished with increased noise (FIG. 8B), but the CNR from "IDEAL" fitting process 400 was significantly higher than that of conventional fitting (P=0.029, paired t-test). The goodness of fit ($R^2$) of the two fitting methods was not significantly different but both gradually decreased with increased noise level (FIG. 8C). Importantly, the total computing time using "IDEAL" fitting 400 was substantially smaller than that of conventional fitting at different noise level (P<0.0001, paired t-test).

Figure 9:
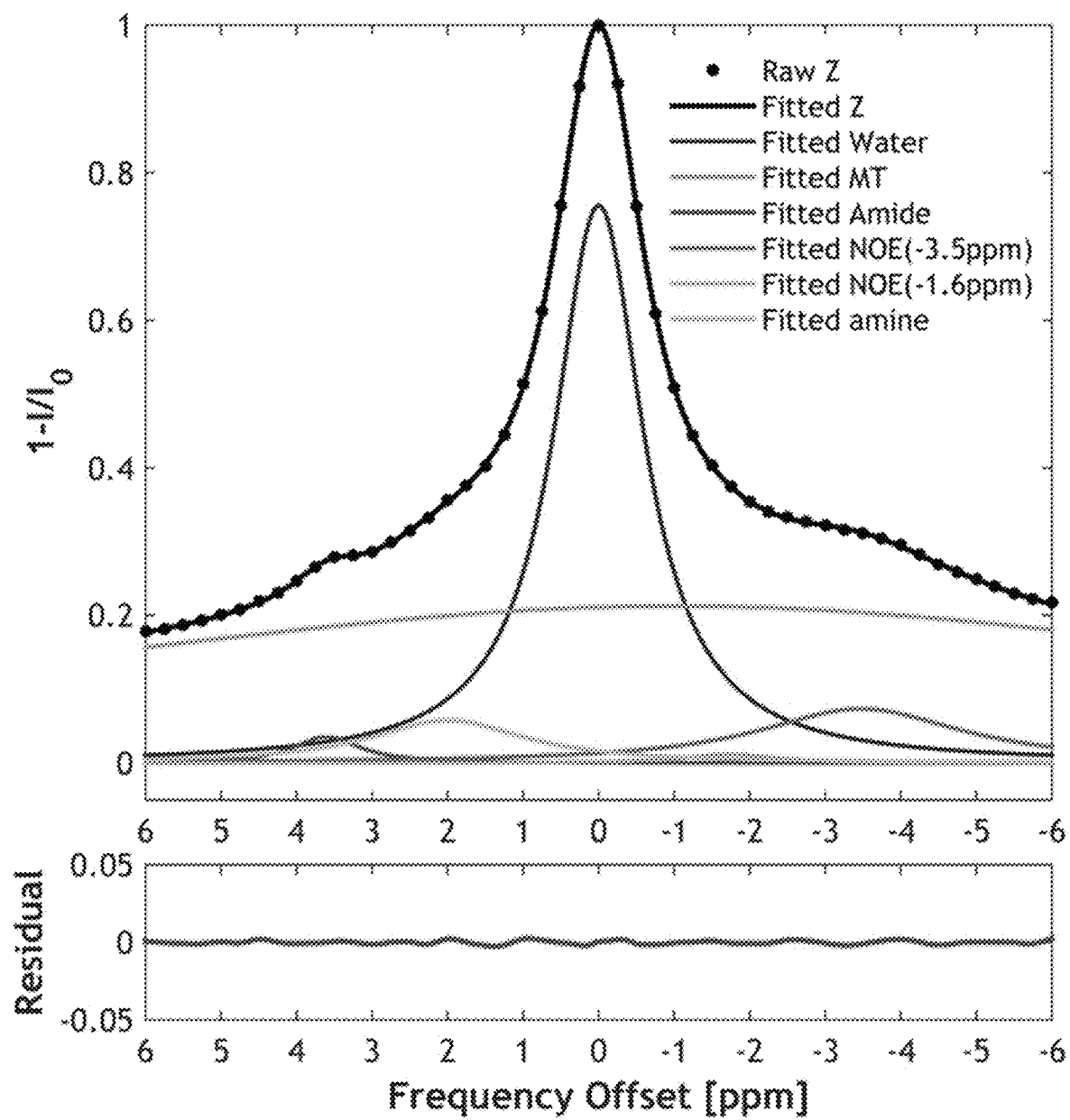
FIG. 9 shows use of multi-pool Lorentzian fit of the global Z spectra from a rat brain to determine initial values for "IDEAL" fitting, including saturation transfer effects from −3.5, −1.6, 2, 3.5 ppm as well as direct saturation and magnetization transfer (MT) contributions.
Figures 10A, 10B, 10C:
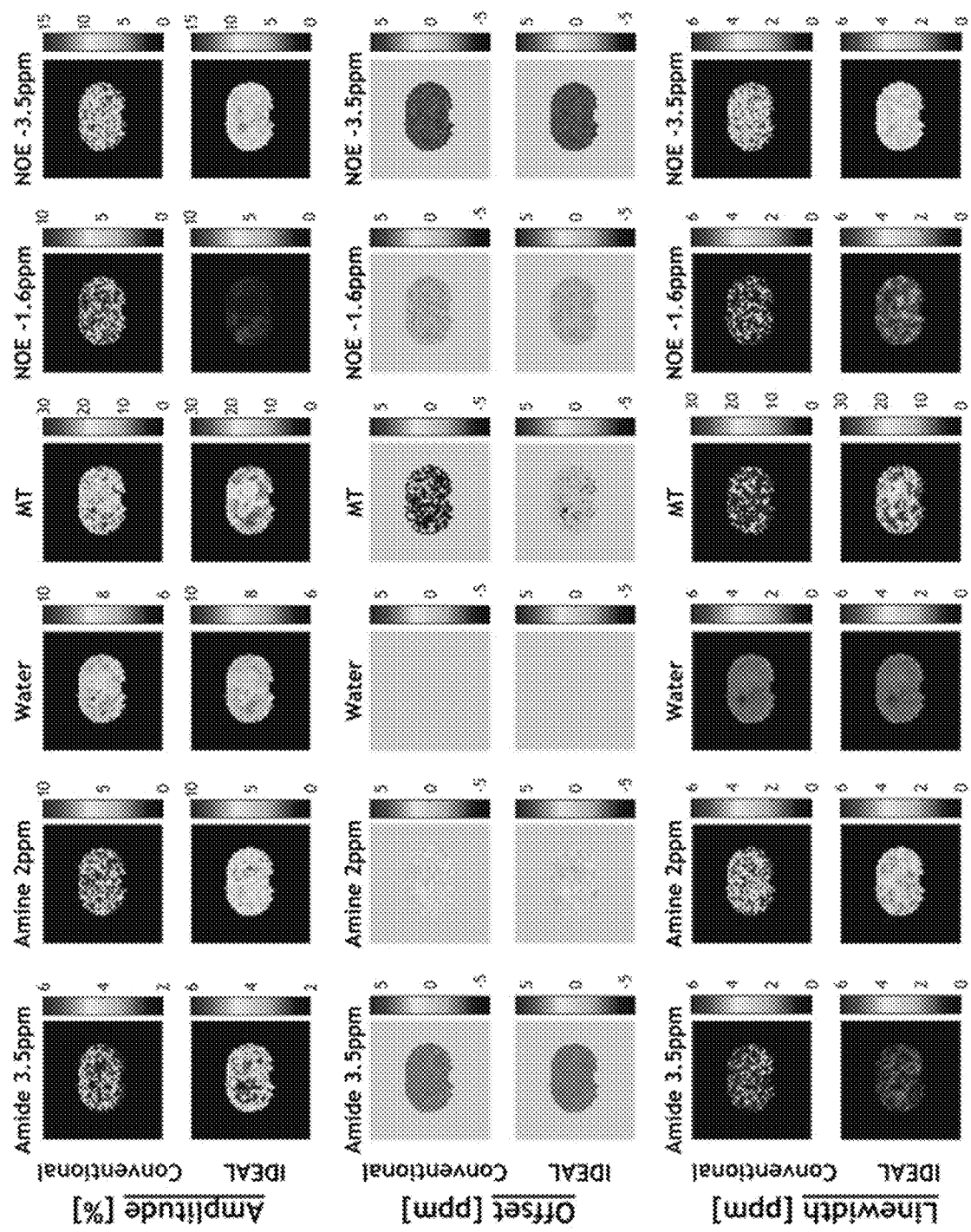
FIG. 10A shows fitted amplitude maps of each pool using conventional fitting and "IDEAL" fitting in a representative rat brain with glioma.
FIG. 10B shows frequency offset maps of each pool using conventional fitting and "IDEAL" fitting in a representative rat brain with glioma.
FIG. 10C shows linewidth maps of each pool using conventional fitting and "IDEAL" fitting in a representative rat brain with glioma.

Animal Study: The exemplary "IDEAL" fitting 400 was further applied to quantify CEST MRI in a rat glioma model. FIG. 9 shows the global Z-spectrum averaged from all voxels within the brain and it was fitted using a six-pool model. The fitting residual had no apparent peaks and was less than 0.26% over the frequency offset range. The fitting results were then used as the initial values for the iterative "IDEAL" fitting process 400. FIGS. 10 A-C shows the fitted amplitude, frequency offset, and linewidth maps of each pool using both the conventional fitting and the "IDEAL" fitting process 400 in a representative rat brain with glioma. The tumor appeared hyperintense in the fitted amide amplitude map using the "IDEAL" fitting 400 (FIG. 10A) yet such contrast was less apparent and clear in the conventional fitting. Furthermore, the amine map using the "IDEAL" fitting process 400 displayed a positive contrast which was not observed in the result from conventional fitting. For both fitting methods, water map showed relatively hyperintensity while MT maps displayed a pronounced signal reduction in the tumor region, as compared to the contralateral normal tissue. Whereas no apparent difference between the tumor and normal regions was found in NOE −3.5 ppm maps, the NOE −1.6 ppm map showed relatively hypointensity in the tumor region. All the amplitude maps fitted by the "IDEAL" process 400 appeared more homogeneous than those from conventional fitting. We also compared the CEST contrasts between the tumor and contralateral normal regions in all the animals (N=8). Both methods showed a significantly higher APT signal ($P<0.001$, paired t-test) and a strong negative MT contrast ($P<0.001$, paired t-test) in the tumor. No significant change in NOE −3.5 ppm signal was found in the tumor ($P=0.16$ and 0.69 for conventional and the "IDEAL" fitting process 400 respectively, paired t-test). Interestingly, the contrast between tumor and normal regions at 2 ppm was significant using the "IDEAL" fitting process 400 ($P<0.05$, paired t-test) but not with conventional fitting ($P=0.20$, paired t-test). Similarly, the "IDEAL" fitting process 400 revealed significant negative contrasts in the tumor in the NOE −1.6 ppm map ($P<0.01$, paired t-test) which was not observed in the map from conventional fitting ($P=0.12$, paired t-test). The fitted offset and linewidth maps were generally homogenous throughout the brain for both methods, but the results from conventional fitting were noisier (FIGS. 10B, 10C).

Figure 11A:
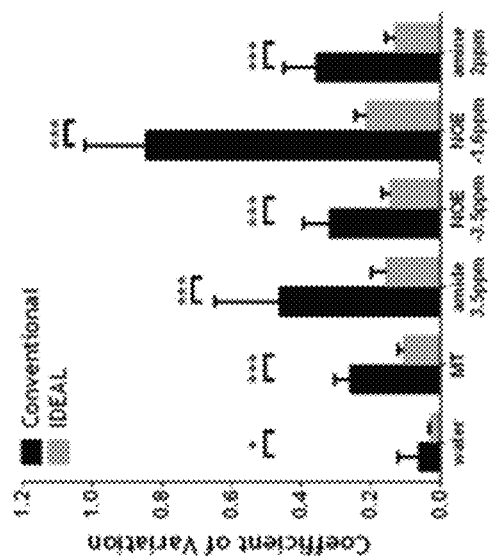
FIG. 11A provides a comparison of fitting quality of conventional fitting and "IDEAL" fitting in rat gliomas (N=8), including the COV of the whole brain. Paired Student's t-test was performed between the two methods with *$P<0.05$ and ***$P<0.001$.
Figure 11B:
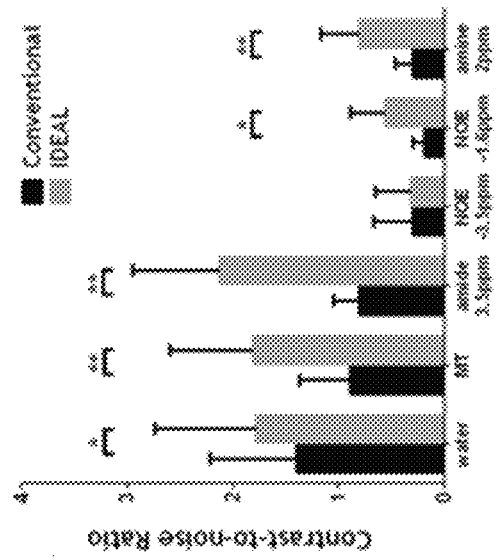
FIG. 11B provides a comparison of fitting quality of conventional fitting and "IDEAL" fitting in rat gliomas (N=8), including contrast-to-noise ratio (CNR) between the normal brain and brain tumor. Paired Student's t-test was performed between the two methods with *$P<0.05$ and **$P<0.01$.
Figure 11C:
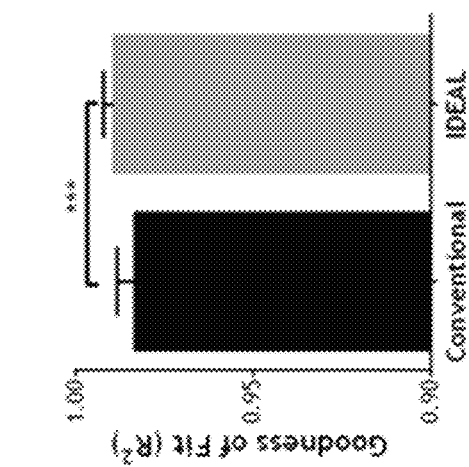
FIG. 11C provides a comparison of fitting quality of conventional fitting and "IDEAL" fitting in rat gliomas (N=8), including $R^2$ of the whole brain. Paired Student's t-test was performed between the two methods with ***$P<0.001$.

FIGS. 11A-11C compare the quality of "IDEAL" and conventional fitting methods in vivo in rat gliomas. The whole-brain COV in the fitted amplitude maps was significantly smaller using the "IDEAL" fitting process 400 for all exchangeable pools (FIG. 11A). More importantly, the "IDEAL" fitting process 400 provides substantially higher CNR in five out of the six pools (FIG. 11B). For all the gliomas studied (N=8), the goodness of fit ($R^2$) of the whole brain was significantly higher using the "IDEAL" fitting process 400 ($P<0.001$, paired t-test).

Figure 12A:
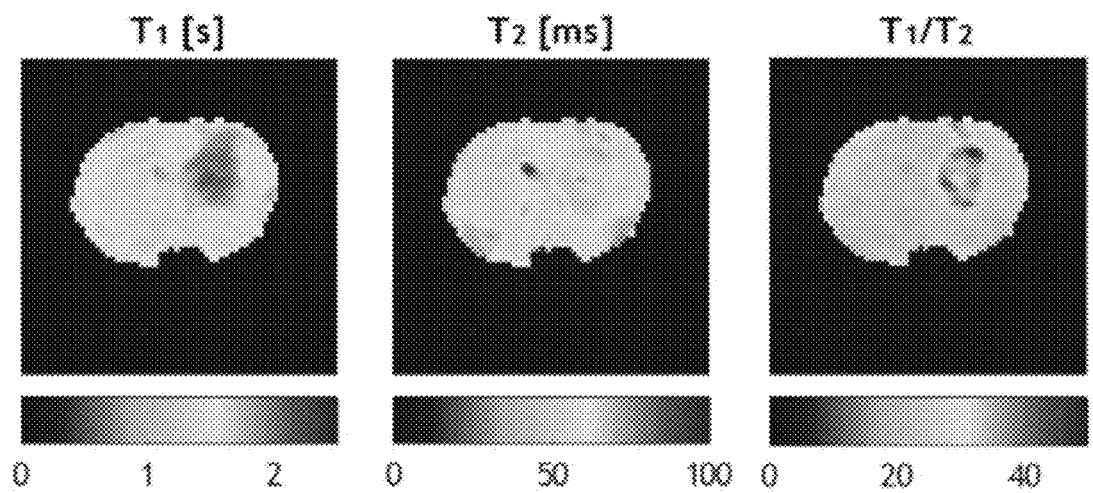
FIG. 12A provides relaxation maps of a representative rat with a D74 glioma tumor. In the T1 map, the tumor core shows the strongest contrast but the elevated T1 gradually reduced from the core to the tumor rim, resulting in an obscure boundary of the tumor. In contrast, substantially lower T2 can be found in the tumor rim but not in the tumor core.
Figure 12B:
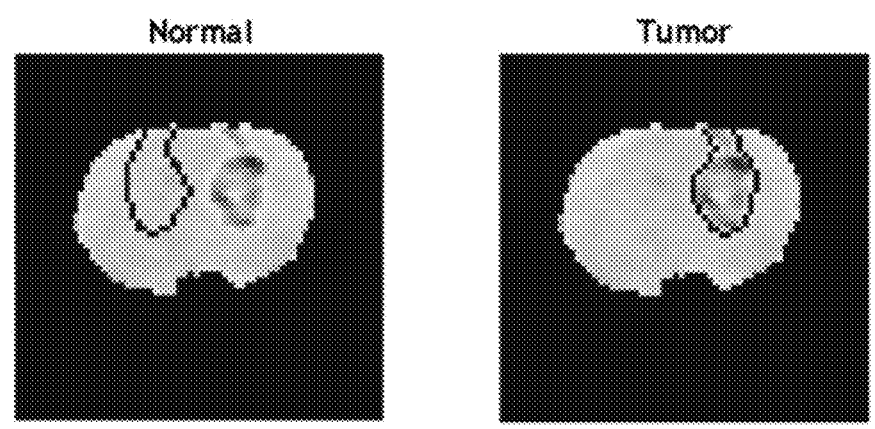
FIG. 12B illustrates that the distinct features of the relaxation maps can be used to define the tumor regions of interest (ROIs) based on the T1/T2 map and mirrored to the contralateral hemisphere as the ROIs of normal tissues.

FIG. 12A provides relaxation maps of a representative rat with a D74 glioma tumor. In the T1 map, the tumor core shows the strongest contrast but the elevated T1 gradually reduced from the core to the tumor rim, resulting in an obscure boundary of the tumor. In contrast, substantially lower T2 can be found in the tumor rim but not in the tumor core. In FIG. 12B, we took advantage of the distinct features of the relaxation maps and defined the tumor ROIs based on the T1/T2 map and mirrored to the contralateral hemisphere as the ROIs of normal tissues.

Exemplary versions discussed use a new fitting approach that harnesses the high SNR of downsampled images for iterative fitting and achieves reliable MRI quantification, such as for CEST MRI. This is significant because in vivo CEST effect is subtle, typically a few percent, with concomitant RF saturation effects that are often non-negligible. The SNR of CEST images can be typically improved by increasing the number of signal averages. However, this prolongs scan time, especially for Z-spectral acquisition. Alternatively, post-processing methods such as spatial smoothing and/or spectral interpolation may be used to achieve higher SNR before multi-pool Lorentzian fitting on a voxel basis. The "IDEAL" fitting approach 400 can combine spline interpolation and spatial downsampling to achieve higher SNR for iterative fitting. On the other hand, proper selection of initial values is important for in vivo CEST fitting, particularly for cases of complex multi-component systems under suboptimal SNR. The "IDEAL" fitting approach 400 avoids arbitrary selection of initial values and minimizes operator bias, enabling automated and adaptive fitting for reliable estimation of CEST effects. The performance of "IDEAL" fitting process 400 was first evaluated in a CEST phantom. Exemplary "IDEAL" fitting 400 results are of smaller COV, higher CNR, and/or comparable goodness of fit at a faster fitting speed when compared to those of the conventional fitting. The fitted maps from exemplary "IDEAL" methods 400 were less noisy, even with the raw CEST images plagued by superimposed noise, likely due to the good initial values determined from high SNR Z-spectra. The use of tightly constrained boundaries after initial fitting can minimize undesirable fluctuations in fitting results due to superimposed noise or poor SNR.

In alternative implementations, the "IDEAL" fitting process 400 was applied to quantify the contributions from APT, amine, NOE, and MT effects in a rat model of glioma. A substantially higher APT signal in the tumor was in line with previous findings using APT imaging of glioma, likely attributable to elevated intracellular mobile proteins/peptides concentration. Both methods showed a strong negative MT contrast in the tumor, consistent with the finding from quantitative MT. In addition, no significant changes in NOE-3.5 ppm were found in the tumor, similar to previous studies using similar irradiation powers. Interestingly, the "IDEAL" fitting revealed a pronounced negative contrast in the tumor in the fitted amine (2 ppm) map which was not observed in the map from conventional fitting. The CEST effect at 2 ppm has been shown to correlate with the creatine level in brain tumor and change with tumor progression. We also found a significant reduction in NOE-1.6 ppm, which was also observed in a recent CEST study of rat glioma at 9.4 T. This effect may originate from choline phospholipids and can be used as a new biomarker for the detection of brain tumor. Indeed, the CNR between the tumor and normal region in the amine and NOE-1.6 ppm map was much smaller than 1 using conventional method. Consequently, the "IDEAL" fitting approach is additionally advantageous in revealing such changes under suboptimal SNR.

Figures 13A, 13B:
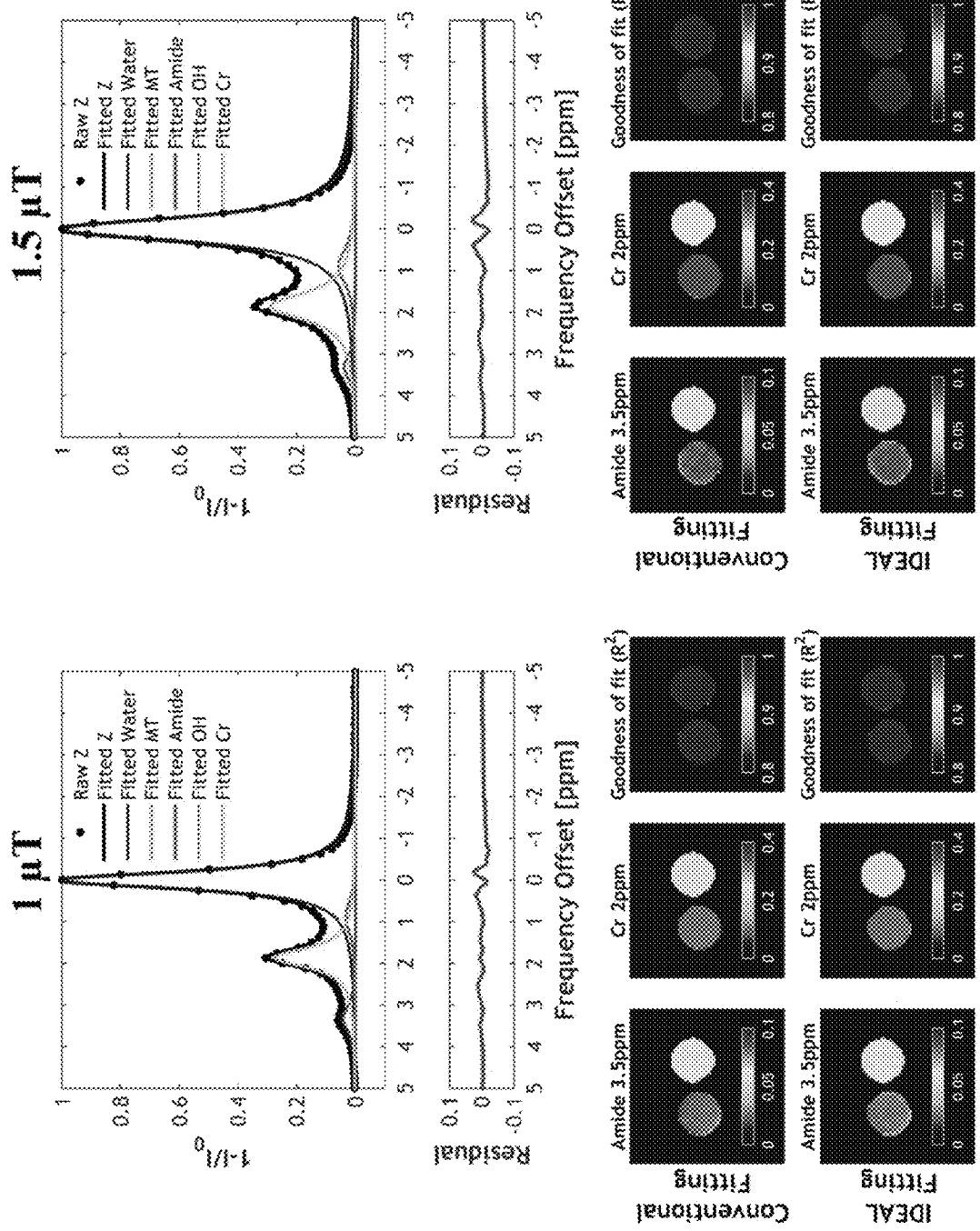
FIG. 13A provides multi-pool Lorentzian fit of the global Z spectra from a two-compartment CEST phantom at RF saturation power of 1 µT to determine initial values for an exemplary "IDEAL" fitting (top). Without added Gaussian noise, the fitting result from conventional voxel-wise multi-pool Lorentzian fitting was compared with that from an "IDEAL" fitting implementation. The CEST phantom contains left: 50 mM Cr and 100 mM amide; right: 100 mM Cr and 50 mM amide.
FIG. 13B provides multi-pool Lorentzian fit of the global Z spectra from a two-compartment CEST phantom at RF saturation power of 1.5 µT to determine initial values for an exemplary "IDEAL" fitting (top). Without added Gaussian noise, the fitting result from conventional voxel-wise multi-pool Lorentzian fitting was compared with that from an "IDEAL" fitting implementation. The CEST phantom contains left: 50 mM Cr and 100 mM amide; right: 100 mM Cr and 50 mM amide.

Although it has been shown that both labile proton concentration and exchange rate can be simultaneously determined from quantitative CEST (qCEST) analysis, its in vivo application is cumbersome due to the presence of complex multiple exchangeable compartments. Lorentzian decoupling may provide reasonable CEST quantification under the case of relatively weak RF saturation power where different CEST peaks can be reliably detected (FIGS. 13A, 13B). The use of strong saturation levels may enhance the CEST effects but it also leads to increased RF spillover and broadened peaks that may substantially overlap with one another, resulting in less reliable decoupling results. Because the typical exchange rates from amide protons, MT, and NOE components for in vivo CEST MRI are relatively slow, it may be advantageous to choose a relatively weak RF irradiation level for experimental optimization and quantification. The exemplary "IDEAL" approach 400 takes advantage of the high SNR of global Z-spectrum so the peaks of CEST effects at various RF saturation power can be reliably identified. The "IDEAL" approach 400 may be further combined with qCEST analysis. Decoupling the complex CEST contrast may be desirable for more accurate quantification using qCEST analysis such as ratiometric or omega plot approaches. Recently, multi-pool Lorentzian fitting has been increasingly employed to isolate the APT and NOE effect from the spillover and MT confounded Z-spectrum. However, such post-processing routines either require acquisition of Z-spectra of wide range of frequency offsets or are limited to cases of prominent APT/NOE effects. On the other hand, the SNR of CEST Z-spectral images can be compromised due to high spatiotemporal resolution and/or the need to obtain densely-sampled Z-spectra quickly. As such, the SNR may be suboptimal for conventional fitting routine. Exemplary implementations of the "IDEAL" fitting facilitate CEST quantification, quickly and reliably. Moreover, "IDEAL" fitting can also be applied to noise prone MRI datasets with a fourth dimension, such as blood oxygenation level dependent (BOLD) functional MRI, dynamic contrast-enhanced (DCE) MRI, dynamic susceptibility contrast (DSC) MRI, and the like. In particular, the systems and methods of the present disclosure may be particularly advantageous where low SNR in images may impede the use of traditional least square fittings because the quality of the initial guess and the noise/quality of that guess can destroy the results.

To generate quantitative maps from MR images, pixel-wise iterative fitting is conventionally performed on a 4D MRI data with time or experimental parameters such as RF pulse frequency offset as fourth dimension. The reliability of iterative fitting, like classical least-squares fitting, depends strongly on a good model, the signal-to-noise ratio (SNR), and the number of data points. However, the SNR of 4D MRI data can be compromised through obtaining high spatial resolution and large number of data points within the limited scan time. Moreover, iterative fitting is highly dependent of the starting points and bounds which can lead to inaccurate fitting results if not properly selected.

Exemplary implementations of "IDEAL" fitting process 400 may use the substantially downsampled images for initial fitting with relaxed constraints. The fitting results are more reliable given the high SNR of downsampled images, and thus are good starting points for the following fine fitting with tightly constrained bounds. The downsampling size may be increased (e.g., doubled) before each round of fine fitting that uses the fitting results from the previous round as starting points until it reaches the original image size. The "IDEAL" fitting methodology 400 can provide smaller coefficient of variation (COV), higher contrast-to-noise ratio (CNR), and comparable goodness of fit at a faster fitting speed as compared to conventional pixel-wise fitting. It can also provide more reliable fitting results under noise.

Compared with prior approaches, exemplary "IDEAL" methods 400 use starting points of iterative fitting determined from fitting of downsampled images. Such an approach provides reliable fitting results with high contrast-to-noise ratio at a faster speed under different levels of noise. The "IDEAL" fitting process 400 can be applied to quantitative MRI or semi-quantitative MRI data with a fourth dimension and an established fitting model, such as quantitative CEST which requires the fitting of Z spectrum, to resolve metabolites at different frequency offsets, to characterize CEST agents, or to quantify physiological information such as pH. In addition, it can be also used for dynamic contrast-enhanced (DCE) MRI, blood oxygenation level dependent (BOLD) functional MRI, dynamic susceptibility contrast (DSC) MRI, etc. It is particularly useful with images that are highly susceptible to noise.

The present disclosure has described one or more preferred embodiments, and it should be appreciated that many equivalents, alternatives, variations, and modifications, aside from those expressly stated, are possible and within the scope of the invention.

We claim:

1. A method for producing a magnetic resonance (MR) image of a subject, the method comprising:
   performing, using a magnetic resonance (MR) system, a pulse sequence that saturates one or more labile spin species from a plurality of voxels in a region-of-interest (ROI) of the subject by applying a radiofrequency (RF) irradiation at a range of frequencies to generate chemical exchange saturation transfer (CEST) data and acquiring the CEST data to generate an initial Z spectra from the plurality of voxels within the ROI;
   defining a mask within the ROI that includes at least one voxel from the plurality of voxels and performing a fitting method on one or more Z spectrum within the mask to generate initial fitted values, wherein generating the initial fitted values further comprises defining the mask within the ROI that includes a plurality of voxels and averaging Z spectra from within the mask to generate a global Z spectrum, wherein the global Z spectrum comprises a higher signal to noise ratio than an individual voxel within the mask;
   generating an initial downsampled Z spectral image based on the initial fitted values;
   iteratively increasing the image resolution of the initial downsampled Z spectral image based on updated fitted values obtained from fitting a previous iteration, wherein the steps of fitting the previous iteration and increasing the image resolution are repeated until a final Z spectral image having a desired image resolution is achieved; and
   generating a quantitative image of the ROI of the subject based on the final Z spectral image.

2. The method of claim 1 wherein the quantitative image is selected from a amide proton transfer image, an amine proton transfer image, a magnetization transfer (MT) image, a nuclear overhauser effect (NOE) image, a blood oxygenation level dependent (BOLD) image, a dynamic contrast-enhanced (DCE) image, and a dynamic susceptibility contrast (DSC) image.

3. The method of claim 2 further comprising using the MR system to display the amide or NOE image, wherein the amide or NOE image includes a tumor in the ROI of the subject that is displayed as hyperintense.

4. The method of claim 1 wherein generating the initial Z spectra within the ROI further comprises applying a field inhomogeneity ($B_0$) correction module.

5. The method of claim 4 wherein the field inhomogeneity ($B_0$) correction module comprises a water saturation shift referencing (WASSR) method.

6. The method of claim 1 wherein generating the initial fitted values further comprises performing the fitting method on the global Z spectrum.

7. The method of claim 1 wherein the fitting method comprises a multi-pool Lorentzian model.

8. The method of claim 7 wherein the multi-pool Lorentzian model is constrained by a set of boundary conditions for each of the iterations, wherein the set of boundary conditions are defined by one or more parameters in the CEST data.

9. The method of claim 8 wherein the one or more parameters is selected from an amplitude, a linewidth, and a frequency offset.

10. The method of claim 8 wherein the set of boundary conditions for each of the iterations includes constraining the initial fitted values to ±10% of the amplitude or the linewidth of the CEST data.

11. The method of claim 8 wherein the set of boundary conditions for each of the iterations includes constraining the initial fitted values to ±5% of the frequency offset of the CEST data.

12. The method of claim 1 wherein the range of frequencies for the RF irradiation ranges between −6 ppm and 6 ppm, and wherein the pulse sequence comprises a single-shot echo planar imaging (EPI) sequence.

13. A method for using a magnetic resonance (MR) system to determine quantitative chemical exchange or exchangeable proton information from a region-of-interest (ROI) in a subject, the method comprising:
performing, using the MR system, a pulse sequence that saturates one or more labile spin species in the ROI by applying a radiofrequency (RF) irradiation at a range of frequencies to generate chemical exchange saturation transfer (CEST) data and acquiring the CEST data from the plurality of voxels in the ROI, wherein acquiring the CEST data from the plurality of voxels in the ROI further comprises generating an initial Z spectra;
generating an initial downsampled Z spectrum matrix based on initial fitted values, wherein the initial fitted values are generated by defining a mask that includes at least one voxel within the ROI and performing a fitting method on one or more Z spectrum within the mask and wherein generating the initial fitted values further comprises defining the mask that includes a plurality of voxels within the ROI and averaging Z spectra from within the mask to generate a global Z spectrum, wherein the global Z spectrum comprises a higher signal to noise ratio than an individual voxel within the mask;
fitting the initial downsampled Z spectrum matrix using the fitting method to obtain updated fitted values, and generating an updated downsampled Z spectrum matrix using the updated fitted values, wherein the updated downsampled Z spectrum matrix is larger than the initial downsampled Z spectrum matrix;
iteratively increasing the size of the updated downsampled Z spectrum matrix based on the updated fitted values obtained from a previous iteration until a final Z spectrum matrix having a desired matrix size is achieved; and
determining at least one quantitative CEST parameter from the ROI of the subject based on the final Z spectrum matrix.

14. The method of claim 13 wherein the fitting method comprises a multi-pool Lorentzian model.

15. A magnetic resonance (MR) system comprising:
a magnet system configured to generate a polarizing magnetic field about at least a portion of a subject arranged in the magnetic resonance (MR) system;
a magnetic gradient system including a plurality of magnetic gradient coils configured to apply at least one magnetic gradient field to the polarizing magnetic field;
a radio frequency (RF) system configured to apply an RF field to the subject and to receive magnetic resonance signals from the subject using a coil array;
a computer system programmed to:
(i) control the magnetic gradient system and RF system to perform a pulse sequence that saturates one or more labile spin species in a plurality of voxels within a region-of-interest (ROI) in the subject to generate chemical exchange saturation transfer (CEST) data, and acquire the CEST data to generate an initial Z spectra from the plurality of voxels within the ROI;
(ii) define a mask within the ROI that includes at least one voxel and performing a fitting method on one or more Z spectrum within the mask to generate initial fitted values, wherein generating the initial fitted values further comprises defining the mask within the ROI that includes a plurality of voxels and averaging Z spectra from within the mask to generate a global Z spectrum, wherein the global Z spectrum comprises a higher signal to noise ratio than an individual voxel within the mask;
(iii) generate an initial downsampled Z spectral image based on the initial fitted values;
(iv) fit the initial downsampled Z spectral image using the fitting method to obtain updated fitted values;
(v) increase the image resolution of the initial downsampled Z spectral image based on the updated fitted values to generate an updated Z spectral image;
(vi) iteratively repeat the steps of fitting the updated Z spectral image and increasing the image resolution of the updated Z spectral image using the updated fitted values from a previous iteration to generate higher resolution updated Z spectral images until a desired image resolution is achieved; and
(vii) generate and display a quantitative image of the ROI of the subject having the desired image resolution.

16. The system of claim 15 wherein the quantitative image generated from the computer system is selected from an amide proton transfer image, an amine proton transfer image, a magnetization transfer (MT) image, a nuclear overhauser effect (NOE) image, a blood oxygenation level dependent (BOLD) image, a dynamic contrast-enhanced (DCE) image, and a dynamic susceptibility contrast (DSC) image.

* * * * *